United States Patent
Shen et al.

(10) Patent No.: US 11,594,607 B2
(45) Date of Patent: *Feb. 28, 2023

(54) GATE FEATURE IN FINFET DEVICE

(71) Applicant: Taiwan Semiconductor Manufacturing Co., Ltd., Hsin-Chu (TW)

(72) Inventors: Guan-Jie Shen, Hsinchu (TW); Chia-Der Chang, Hsinchu (TW); Chih-Hsiung Lin, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 50 days.

This patent is subject to a terminal disclaimer.

(21) Appl. No.: 17/164,261

(22) Filed: Feb. 1, 2021

(65) Prior Publication Data
US 2021/0184013 A1 Jun. 17, 2021

Related U.S. Application Data

(60) Continuation of application No. 16/881,486, filed on May 22, 2020, now Pat. No. 10,910,479, which is a continuation of application No. 16/378,342, filed on Apr. 8, 2019, now Pat. No. 10,665,686, which is a division of application No. 15/652,673, filed on Jul. 18, 2017, now Pat. No. 10,276,680.

(51) Int. Cl.
*H01L 27/088* (2006.01)
*H01L 29/423* (2006.01)
*H01L 29/78* (2006.01)
*H01L 21/28* (2006.01)
*H01L 29/66* (2006.01)
*H01L 21/3213* (2006.01)
*H01L 29/417* (2006.01)

(52) U.S. Cl.
CPC .. *H01L 29/42376* (2013.01); *H01L 21/28114* (2013.01); *H01L 21/32137* (2013.01); *H01L 29/41791* (2013.01); *H01L 29/6653* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 10,276,680 | B2 | 4/2019 | Shen |
| 10,665,686 | B2 | 5/2020 | Shen |
| 2007/0004117 | A1 | 1/2007 | Yagishita |
| 2007/0158763 | A1 | 7/2007 | Anderson |

(Continued)

*Primary Examiner* — Ali Naraghi
(74) *Attorney, Agent, or Firm* — Duane Morris LLP

(57) ABSTRACT

A semiconductor device includes a substrate; a fin structure formed on a substrate; and a gate feature formed over the fin structure, the gate feature comprising a gate dielectric layer, wherein the gate dielectric layer traverses the fin structure to overlay a central portion of the fin structure and opposite side portions of the fin structure that are located in respective undercuts formed in respective portions of a dielectric layer located adjacent to opposite sidewalls of the gate feature, wherein the undercuts extend beyond respective sidewalls of the gate feature and away from the central portion of the fin structure.

20 Claims, 36 Drawing Sheets

(56) References Cited

U.S. PATENT DOCUMENTS

| | | |
|---|---|---|
| 2009/0206406 A1 | 8/2009 | Rachmady |
| 2016/0013186 A1* | 1/2016 | Bae .................... H01L 29/161 |
| | | 257/288 |
| 2016/0111531 A1 | 4/2016 | Dong |
| 2016/0240534 A1* | 8/2016 | Murthy ............... H01L 21/3065 |
| 2016/0314963 A1* | 10/2016 | Choi .................... H01L 21/324 |
| 2016/0359017 A1* | 12/2016 | Park .................. H01L 21/28114 |
| 2017/0098711 A1* | 4/2017 | Hsiao .................. H01L 29/785 |
| 2017/0255735 A1* | 9/2017 | Kim ..................... G06F 30/392 |

\* cited by examiner

GATE FEATURE IN FINFET DEVICE

CROSS-REFERENCE OF RELATED APPLICATION

This application is a Continuation Application Ser. No. 16/881,486, filed May 22, 2020, which is a Continuation Application of U.S. patent application Ser. No. 16/378,342 filed Apr. 8, 2019, which is a Divisional Application of U.S. patent application Ser. No. 15/652,673, filed Jul. 18, 2017, the contents of each are incorporated by reference herein in their entireties.

BACKGROUND

Integrated circuits (IC's) typically include a large number of components, particularly transistors. One type of transistor is a metal-oxide-semiconductor field-effect-transistor (MOSFET). MOSFET devices typically include a gate structure on top of a semiconductor substrate. Both sides of the gate structure are doped to form source and drain regions. A channel is formed between the source and drain regions beneath the gate. Based on a voltage bias applied to the gate, electric current may either be allowed to flow through the channel or be inhibited from doing so.

In some cases, the channel may be formed as a fin-like structure (herein "fin"). Such a fin protrudes beyond a top surface of the substrate and runs perpendicular to the gate structure formed on the substrate and the fin. In general, a field-effect-transistor using such a fin as a channel is referred to as a fin field-effect-transistor ("FinFET"). A conventional replacement gate process is typically used to make the gate feature of such a FinFET. The conventional replacement gate process typically includes forming a dummy gate over a central portion of the fin, voiding the dummy gate, refilling such a void with a gate dielectric layer (e.g., a high-k dielectric material), and subsequently overlaying the gate dielectric layer with at least one conductive material (e.g., a metal material) so as to form a metal gate feature that includes the gate dielectric layer and the conductive material over the central portion of the fin, which is the channel of the FinFET.

In particular, the dummy gate typically has two substantially vertical sidewalls, wherein each sidewall is formed as a single continuous surface, which causes the void to have respective sidewalls that are each a continuous surface extending from respective bottom to top. As such, when refilling the void with the gate dielectric layer and subsequently with the at least one conductive material, due to the single continuous sidewall of the void, the conductive material cannot surround the fin channel thoroughly, especially at end portions of the fin channel. This can disadvantageously cause various issues such as, for example, a poor gate controllability of the FinFET, a severer drain-induced barrier lowering (DIBL) effect, etc. Thus, conventional FinFET's gate features and techniques to form the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
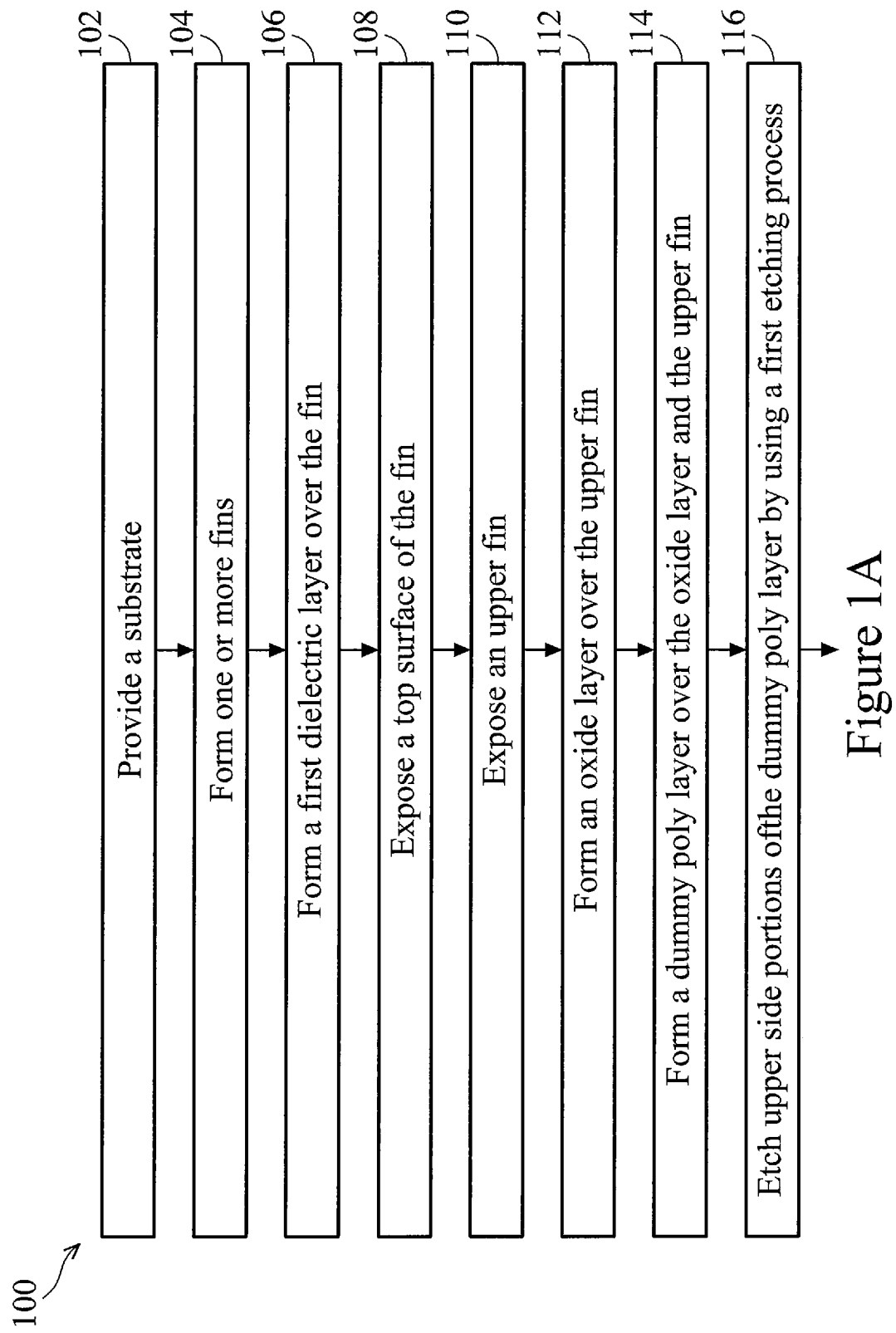
FIGS. 1A and 1B illustrate a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a fin field-effect-transistor (FinFET) that includes a gate feature formed in a void with horizontally extended cavities. More specifically, such cavities are each formed at a bottom of the void and to extend beyond a vertical projection of respective sidewall of the void. As such, when the gate feature, including a gate dielectric layer and at least one metal layer overlaying the gate dielectric layer, is formed by refilling the void and the extended cavities, the metal layer can thoroughly surround the FinFET's fin channel, which advantageously eliminates the above-mentioned issues.

Figure 1B:
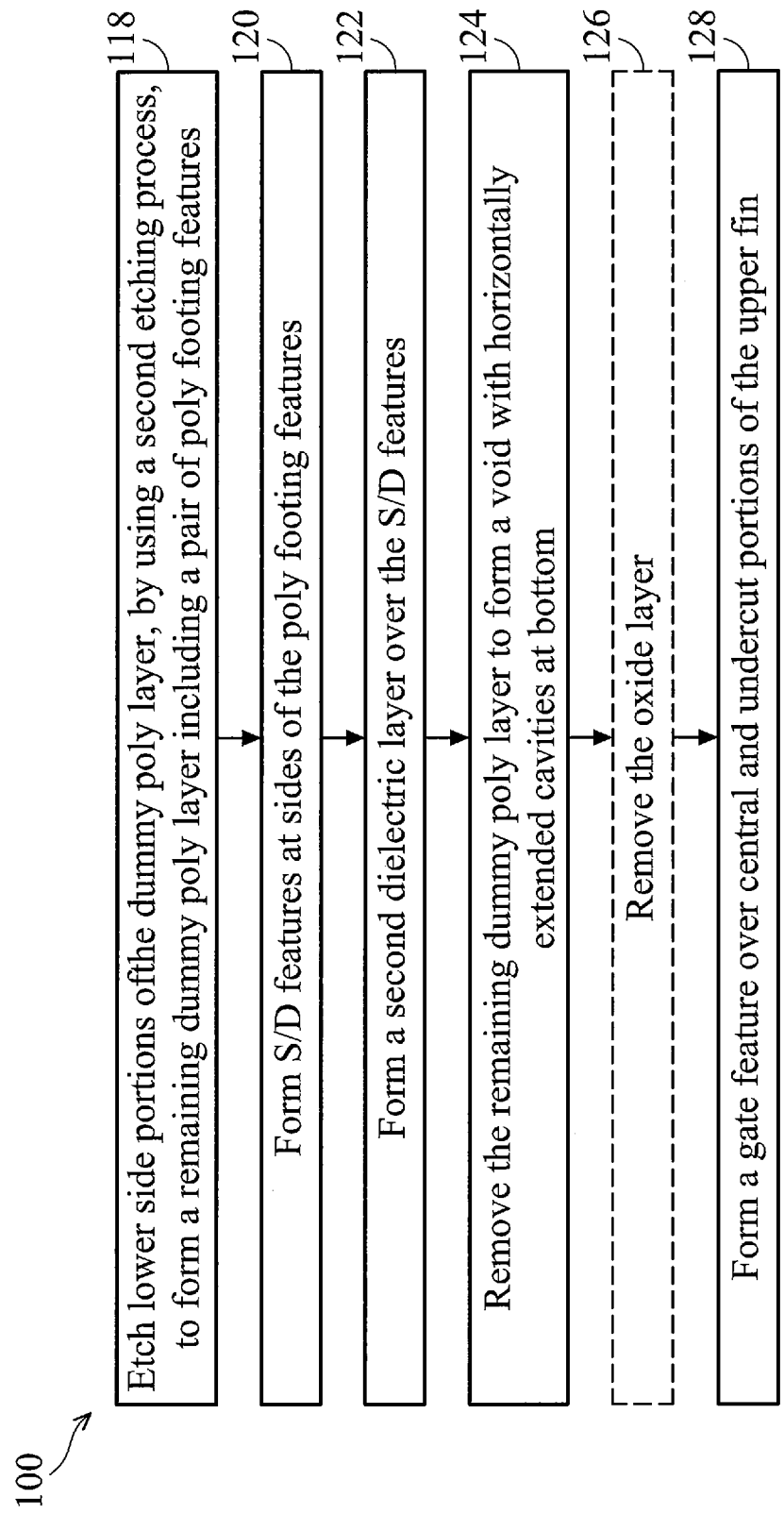

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a FinFET. As employed in the present disclosure, the FinFET refers to any fin-based, multi-gate transistor. It is noted that the method of FIGS. 1A-1B does not produce a completed FinFET. A completed FinFET may be fabricated using complementary metal-oxide-semiconductor (CMOS) technology processing. Accordingly, it is understood that additional operations may be provided before, during, and after the method 100 of FIGS. 1A-1B, and that some other operations may only be briefly described herein.

In some embodiments, the method 100 starts with operation 102 in which a semiconductor substrate is provided. The method 100 continues to operation 104 in which one or more fins are formed extending beyond a major surface of the semiconductor substrate. The method 100 continues to operation 106 in which a dielectric material is deposited over the semiconductor substrate to overlay the fin. The method 100 continues to operation 108 in which a top surface of the fin is exposed. The method 100 continues to operation 110 in which an upper fin of the fin is exposed. The method 100 continues to operation 112 in which an oxide layer is formed over the exposed upper fin. The method 100 continues to operation 114 in which a dummy poly (e.g., polysilicon) layer (hereinafter "dummy poly layer") is formed over the oxide layer and the upper fin. The method 100 continues to operation 116 in which upper side portions of the dummy poly layer are etched using a first etching process. The method 100 continues to operation 118 in which lower side portions of the dummy poly layer are etched using a second etching process so as to form a remaining dummy poly layer including a pair of poly footing features that surround part of sidewalls and part of top surfaces of side portions of the oxide layer. The method 100 continues to operation 120 in which source/drain (S/D) features are respectively formed at sides of the pair of poly footing features. The method 100 continues to operation 122 in which a second dielectric layer is formed over the S/D features. The method 100 continues to operation 124 in which the remaining dummy poly layer, including the poly footing feature, is removed so as to form a void with horizontally extended cavities at a bottom of the void that exposes a middle portion and further a side portion of the oxide layer. In some embodiments, the side portion extends outwardly beyond a vertical projection of the void's sidewall, which will be described in further detail below. The method 100 continues to optional operation 126 in which the exposed portions of the oxide layer are removed so as to expose middle and side portions of the upper fin. The method 100 continues to operation 128 in which a gate feature is formed over the middle and side portions of the upper fin or the oxide layer, if the oxide layer is not removed.

In some embodiments, operations of the method 100 may be associated with perspective views of a semiconductor device 200 at various fabrication stages as shown in FIGS. 2A, 3A, 4A, 5A, 6A, 7A, 8A, 9A, 10A, 11A, 12A, 13A, 14A, respectively, and corresponding cross-sectional views, taken along a first direction, as shown in FIGS. 2B, 3B, 4B, 5B, 6B, 7B, 8B, 9B, 10B, 11B, 12B, and 13B. Further, operations of the method 100 associated with the perspective views of the semiconductor device 200 in FIGS. 8A, 9A, 10A, 11A, 12A, 13A, and 14A may be associated with corresponding cross-sectional views, taken along a second direction, as shown in FIGS. 8C, 9C, 10C, 11C, 12C, 13C, and 14C. In some embodiments, the semiconductor device 200 may be a FinFET. The FinFET 200 may be included in a microprocessor, memory cell, and/or other integrated circuit (IC). FIGS. 2A through 14C are simplified for a better understanding of the concepts of the present disclosure. For example, although the figures illustrate the FinFET 200, it is understood that the IC may comprise a number of other devices comprising resistors, capacitors, inductors, fuses, etc., which are not shown in FIGS. 2A through 14C, for purposes of clarity of illustration.

Figure 2A:
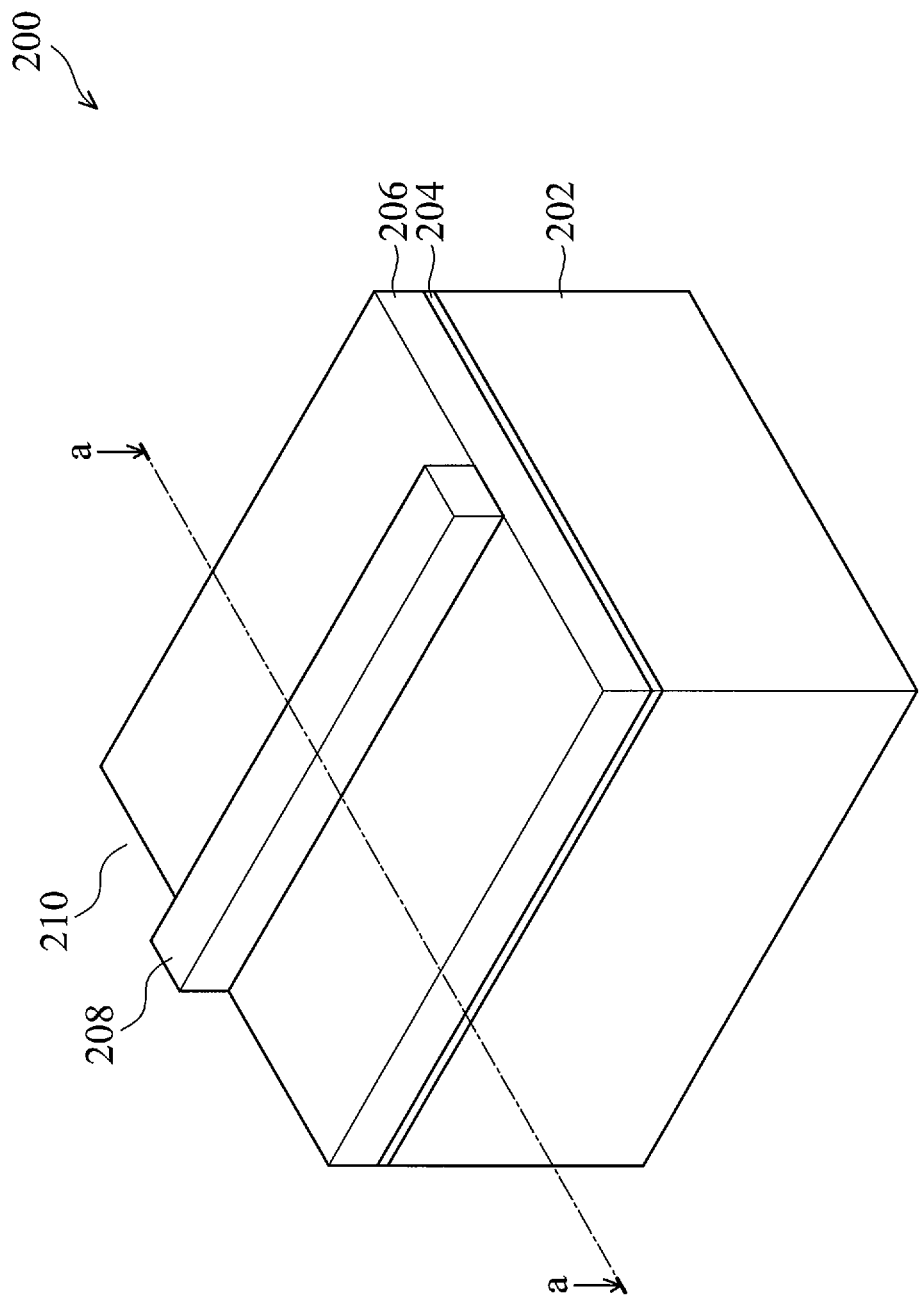
FIGS. 2A, 3A, 4A, 5A, 6A, 7A, 8A, 9A, 10A, 11A, 12A, 13A, and 14A illustrate perspective views of an exemplary semiconductor device, made by the method of FIGS. 1A-1B, during various fabrication stages, in accordance with some embodiments.
Figure 2B:
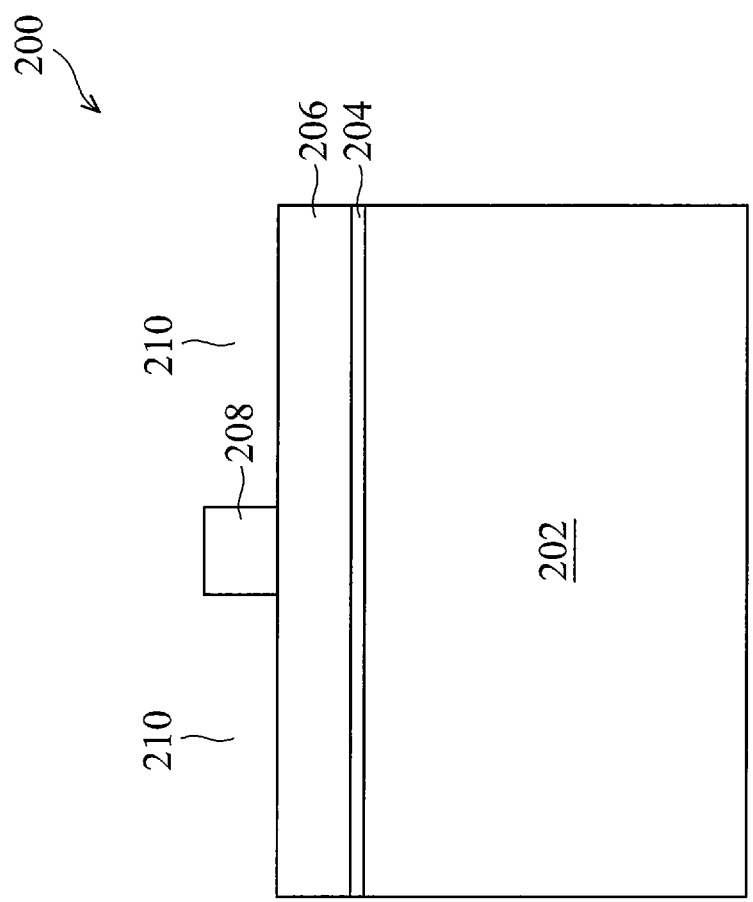
FIGS. 2B, 3B, 4B, 5B, 6B, 7B, 8B, 9B, 10B, 11B, 12B, 13B, and 14B illustrate corresponding cross-sectional views of FIGS. 2A, 3A, 4A, 5A, 6A, 7A, 8A, 9A, 10A, 11A, 12A, 13A, and 14A taken along a first direction, in accordance with some embodiments.

Corresponding to operation 102 of FIG. 1A, FIG. 2A is a perspective view of the FinFET 200 including a substrate 202 at one of the various stages of fabrication, according to some embodiments, and FIG. 2B is a cross-sectional view of the FinFET 200 taken along line a-a (along the X direction) of FIG. 2A. As shown, the substrate 202 is covered by a pad layer 204, a first mask layer 206, and a photo-sensitive layer 208 that is patterned with one or more openings 210. The photo-sensitive layer 208 is patterned to form one or more fins of the FinFET 200, which will be discussed in the following operations.

In some embodiments, the substrate 202 comprises a crystalline silicon substrate (e.g., wafer). In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In some embodiments, the pad layer 204 may be a thin film comprising silicon oxide formed, for example, using a thermal oxidation process. The pad layer 204 may act as an adhesion layer between the semiconductor substrate 202 and the first mask layer 206. The pad layer 204 may also act as an etch stop layer while etching the first mask layer 206. In some embodiments, the first mask layer 206 is formed of silicon nitride (SiN), silicon carbon nitride (SCN), silicon oxide nitride (SON), or the like, for example, using low-pressure chemical vapor deposition (LPCVD), plasma enhanced chemical vapor deposition (PECVD), or spin-on coating. The first mask layer 206 is used as a hard mask during subsequent photolithography processes. The photo-sensitive layer 208 is formed on the first mask layer 206, and then patterned thereby forming the openings 210 in the photo-sensitive layer 208.

Figure 3A:
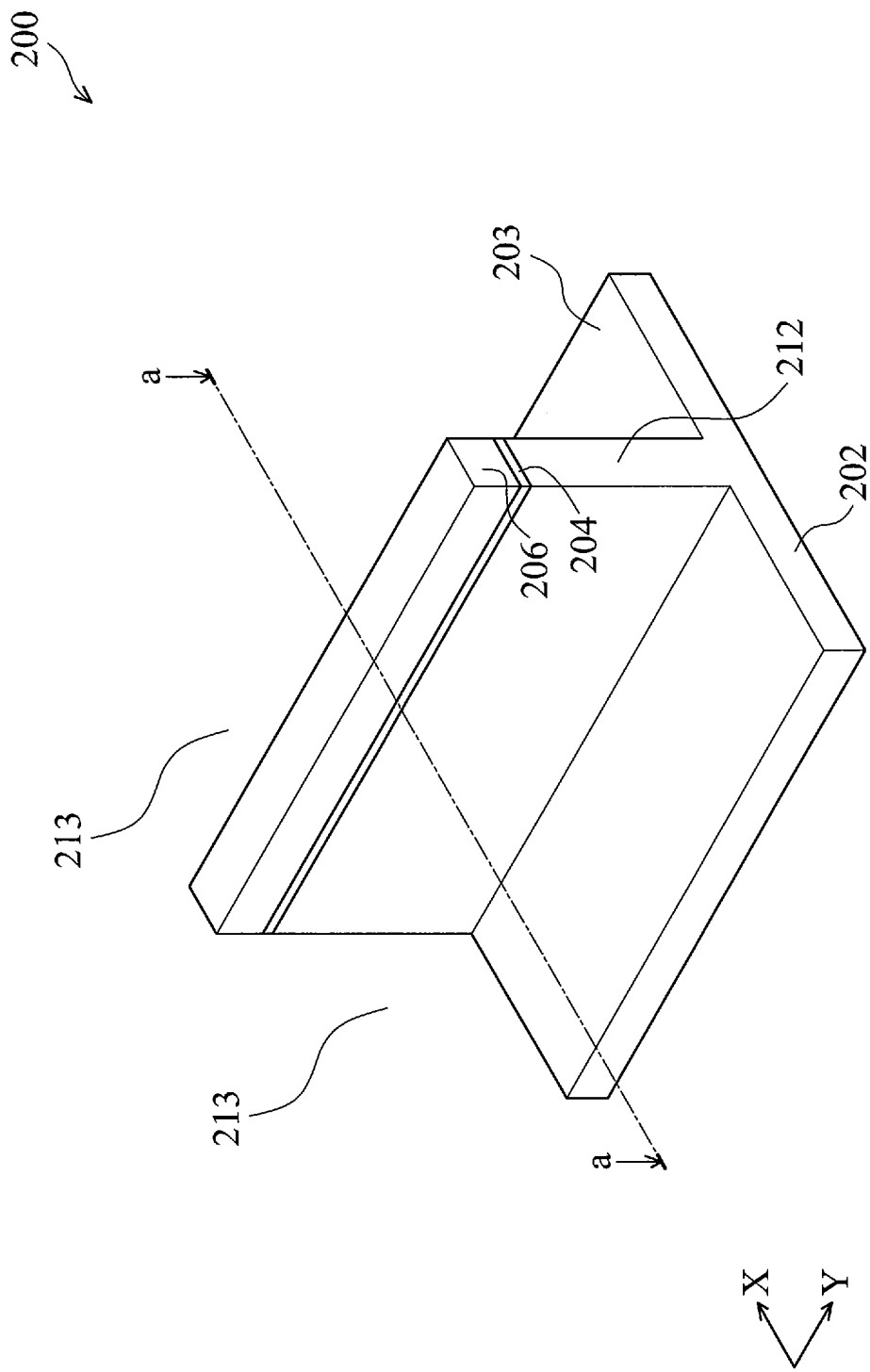
Figure 3B:
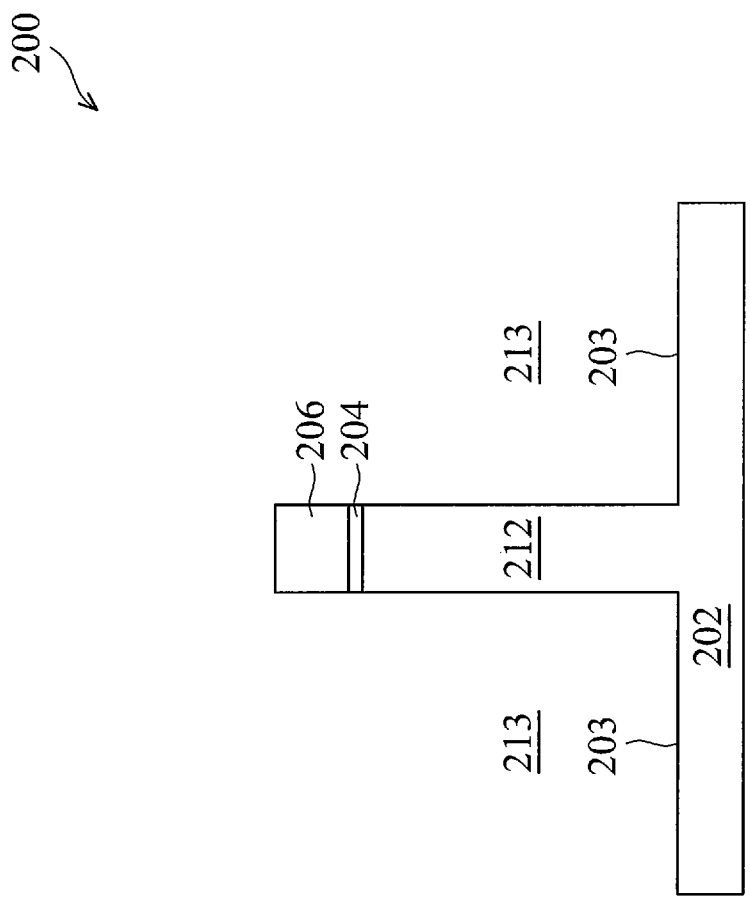

Corresponding to operation 104 of FIG. 1A, FIG. 3A is a perspective view of the FinFET 200 including a fin 212 at one of the various stages of fabrication, according to some embodiments, and FIG. 3B is a cross-sectional view of the FinFET 200 taken along line a-a (along the X direction) of FIG. 3A. It is noted that although only one fin 212 is shown in the illustrated embodiments of FIGS. 3A and 3B (and the following figures), any desired number of fins may be formed on the semiconductor substrate 202 using the photo-sensitive layer 208 (FIGS. 2A and 2B) with an according pattern.

In some embodiments, the fin 212 is formed by at least some of the following processes. The first mask layer 206 and pad layer 204 are etched through openings 210 (FIGS. 2A and 2B) to expose underlying semiconductor substrate 202. By using remaining pad layer 204 and the first mask layer 206, as shown in FIGS. 3A and 3B, the exposed semiconductor substrate 202 is then etched to form trenches 213 so as to cause a major surface 203 of the semiconductor substrate 202 to be exposed. A portion of the semiconductor substrate 202 sandwiched between the trenches 213 are thus formed as the fin 212. The fin 212 extends upward from the major surface 203. The trenches 213 may be strips (viewed from the top of the FinFET 200) parallel to each other, and closely spaced with respect to each other. After the fin 212 is formed, the photo-sensitive layer 208 (not shown in FIGS. 3A and 3B for purposes of clarity) is removed. Subsequently, a cleaning process may be performed to remove a native oxide of the semiconductor substrate 202. The cleaning may be performed using diluted hydrofluoric (DHF) acid, or the like.

Figure 4A:
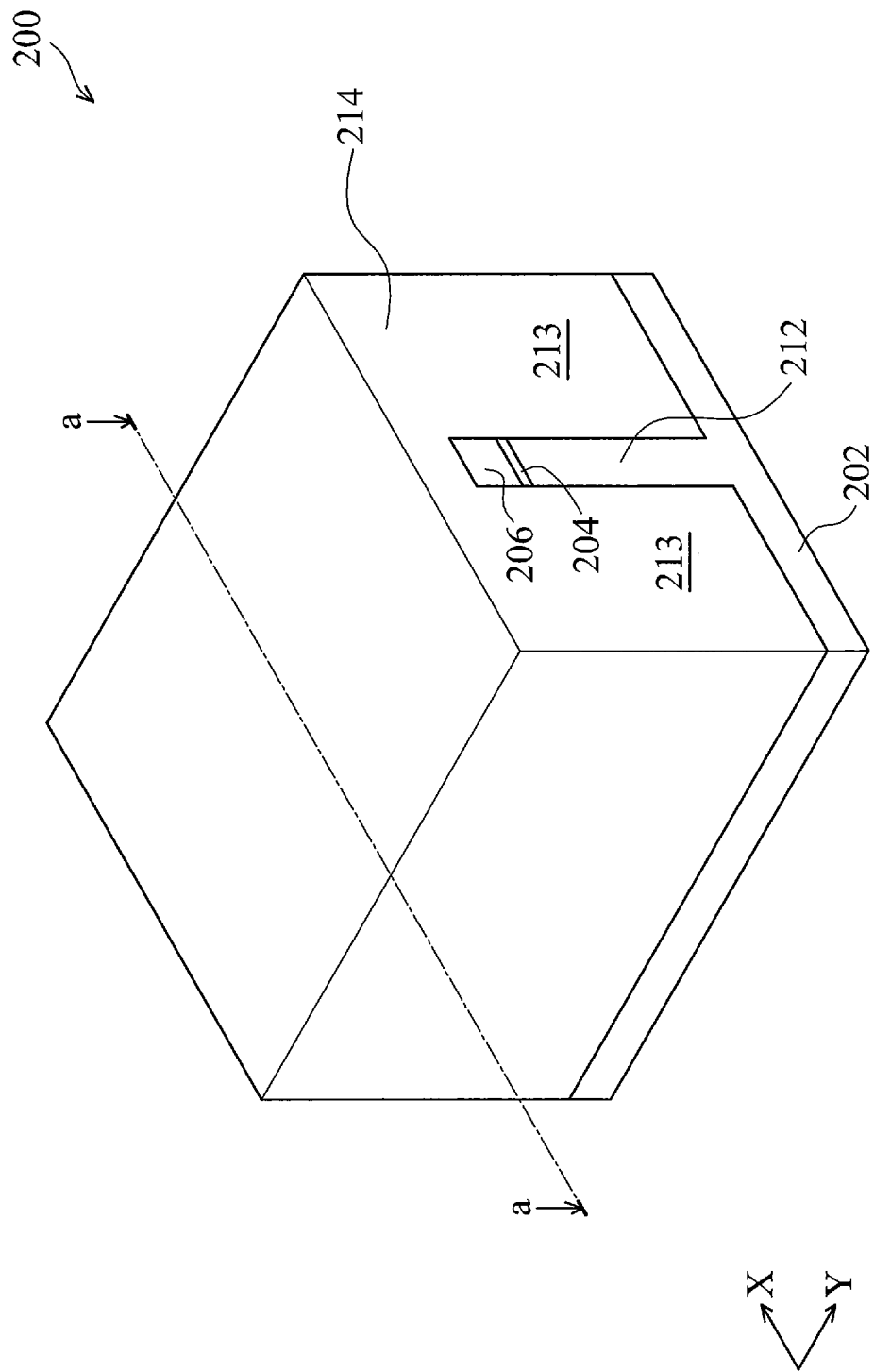
Figure 4B:
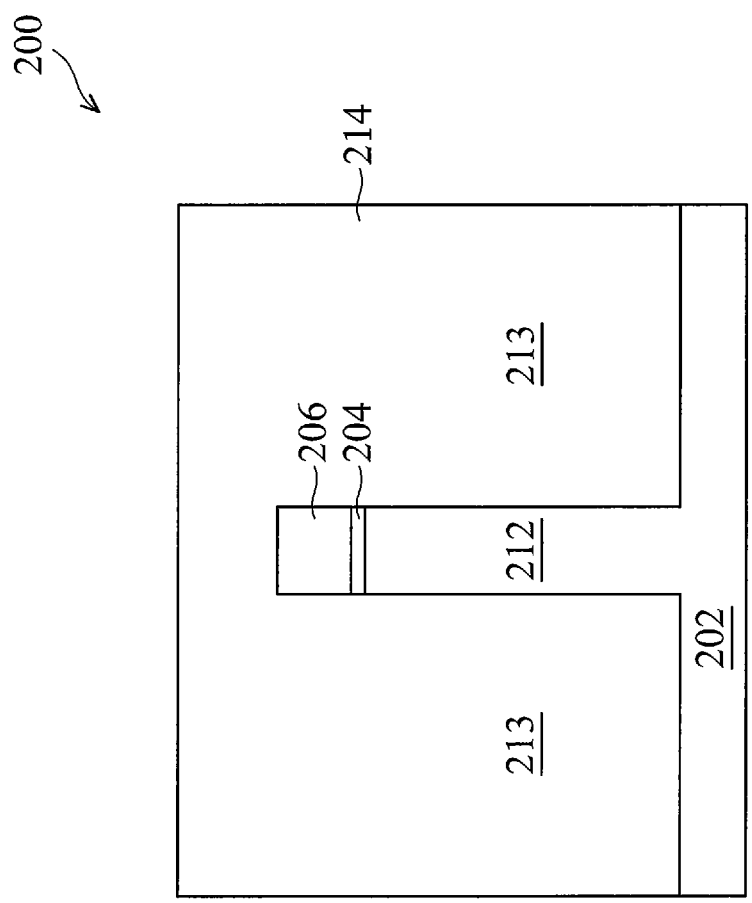

Corresponding to operation 106 of FIG. 1A, FIG. 4A is a perspective view of the FinFET 200 including a dielectric material 214 formed over the substrate 202, the fin 212, the pad layer 204, and the first mask layer 206 at one of the various stages of fabrication, according to some embodiments, and FIG. 4B is a cross-sectional view of the FinFET 200 taken along line a-a (along the X direction) of FIG. 4A. As shown, the dielectric material 214 is formed over the whole FinFET 200 such that the entire trenches 213 are filled by the dielectric material 214.

In an embodiment, the dielectric material 214 may be deposited over the substrate 202 using a high-density-plasma (HDP) CVD process with reacting precursors, e.g., silane ($SiH_4$) and oxygen ($O^2$). In another embodiment, the dielectric material 214 may be deposited over the substrate 202 using a sub-atmospheric CVD (SACVD) process or a high aspect-ratio process (HARP), wherein process gases used in such processes may comprise tetraethylorthosilicate (TEOS) and ozone ($O_3$). In yet another embodiment, the dielectric material 214 may be deposited over the substrate 202 using a spin-on-dielectric (SOD) process such as, for example, hydrogen silsesquioxane (HSQ), methyl silsesquioxane (MSQ), or the like.

Figure 5A:
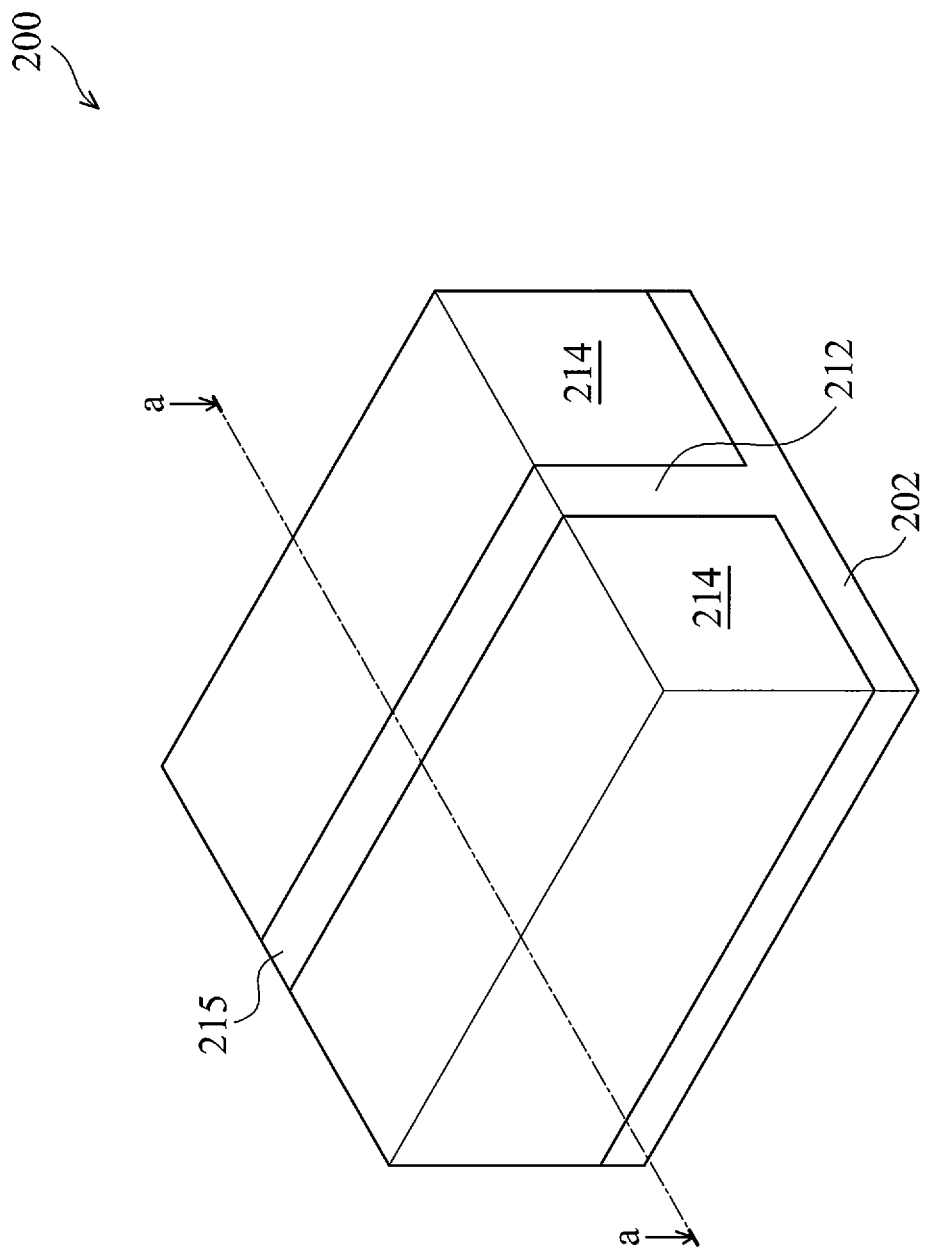
Figure 5B:
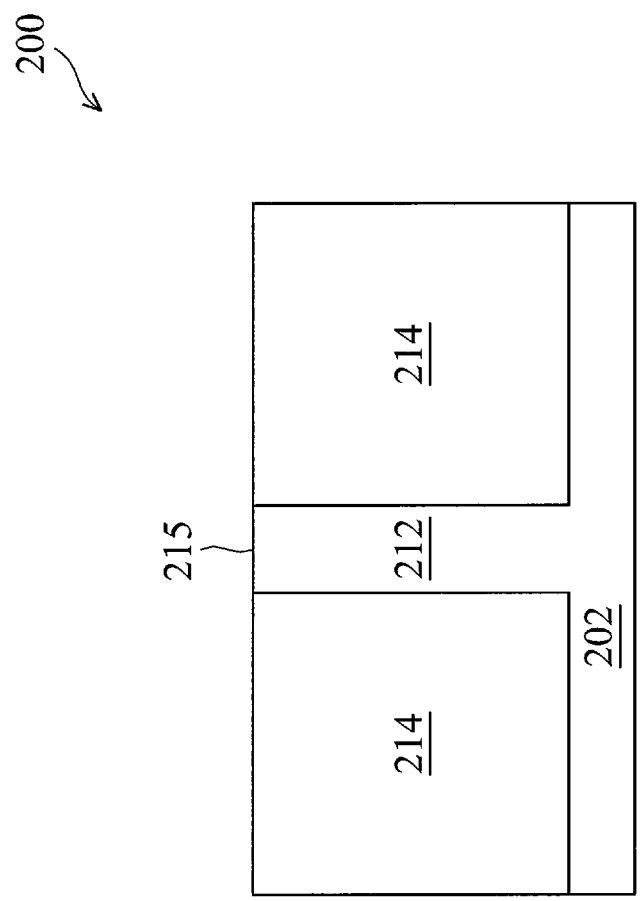

Corresponding to operation 108 of FIG. 1A, FIG. 5A is a perspective view of the FinFET 200 including top surfaces 215 of the fins 212 being exposed at one of the various stages of fabrication, according to some embodiments, and FIG. 5B is a cross-sectional view of the FinFET 200 taken along line a-a (along the X direction) of FIG. 5A. In some embodiments, the top surface 215 is exposed by performing a polishing process (e.g., a chemical-mechanical polishing process) on the dielectric material 214 (FIGS. 4A and 4B) until the first mask layer 206 is again exposed. The first mask layer 206 and the pad layer 204 are then removed to expose the top surface 215.

In some embodiments, when the first mask layer 206 is formed of silicon nitride, the first mask layer 206 may be removed using a wet process using hot phosphoric acid ($H_3PO_4$), and when the pad layer 204 is formed of silicon oxide, the pad layer 204 may be removed using diluted hydrofluoric acid (HF). In some alternative embodiments, the removal of the first mask layer 206 and the pad layer 204 may be performed after a recession process performed on the dielectric material 214, which will be discussed in FIGS. 6A and 6B as follows.

Figure 6A:
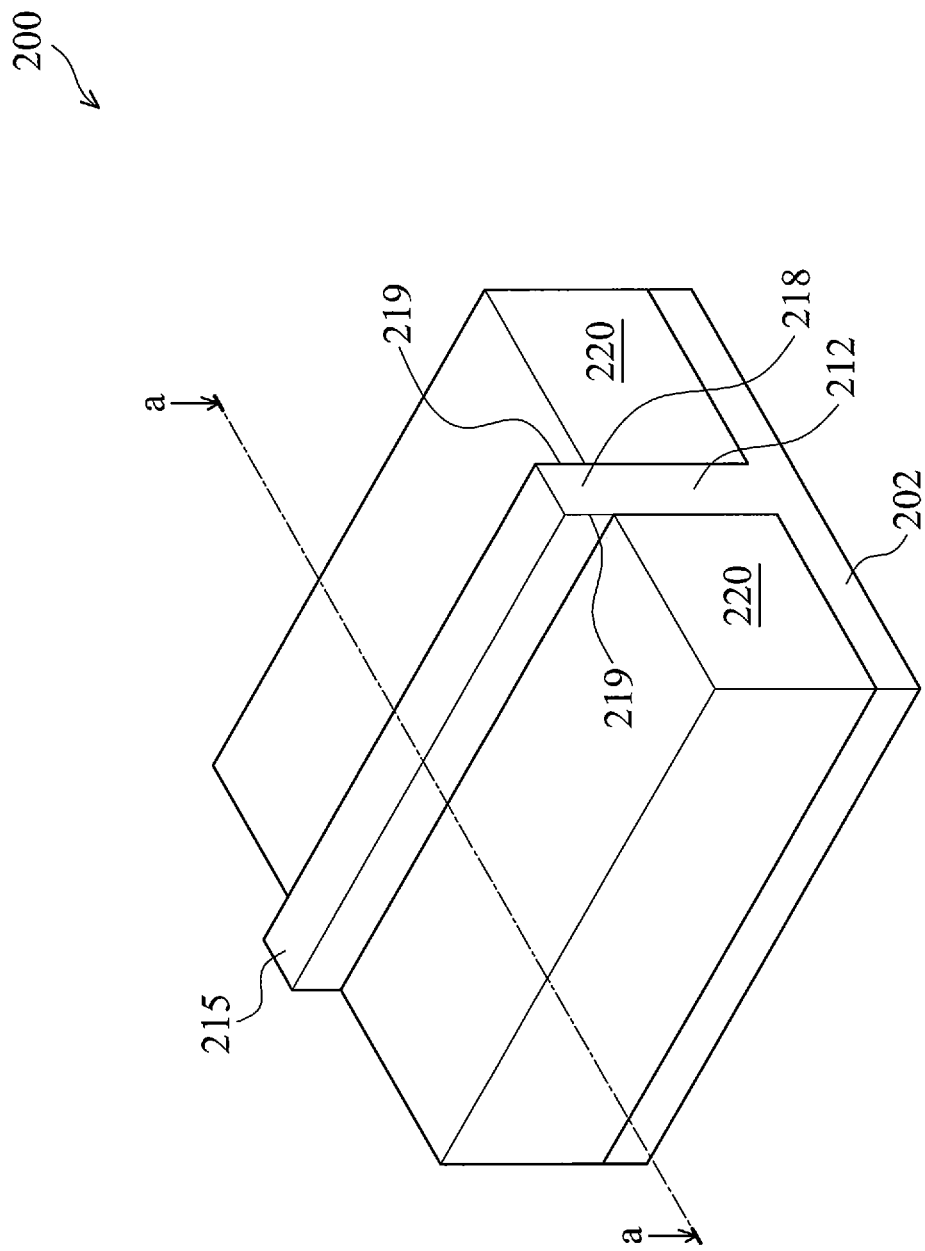
Figure 6B:
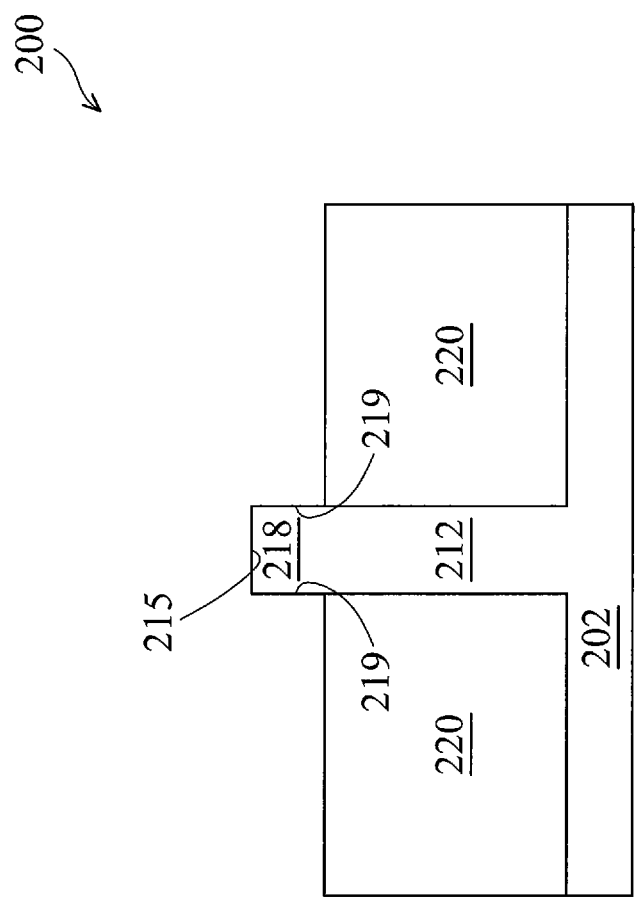

Corresponding to operation 110 of FIG. 1A, FIG. 6A is a perspective view of the FinFET 200 including an upper fin 218 of the fin 212 being exposed at one of the various stages of fabrication, according to some embodiments, and FIG. 6B is a cross-sectional view of the FinFET 200 taken along line a-a (along the X direction) of FIG. 6A. As shown, isolation features 220 are respectively formed at a lower portion of the fin 212 so as to expose the upper fin 218. In some embodiments, after the upper fin 218 is exposed, sidewalls 219 of the upper fin 218 are exposed together with the respective top surface 215.

In some embodiments, the isolation feature 220 may be formed by performing at least one etching process to recess an upper portion of the dielectric material 214 (FIGS. 5A and 5B). In an embodiment, the etching process may include performing a wet etching process such as, for example, dipping the substrate 202 in a hydrofluoric acid (HF) solution to recess the upper portion of the dielectric material 214 until the upper fin 218 is exposed. In another embodiment, the etching process may include performing a dry etching process such as, for example, using etching gases fluoroform ($CHF_3$) and/or boron trifluoride ($BF_3$) to recess the upper portion of the dielectric material 214 until the upper fin 218 is exposed. In some embodiments, the isolation feature 220 may be referred to as a shallow trench isolation (STI).

Figure 7A:
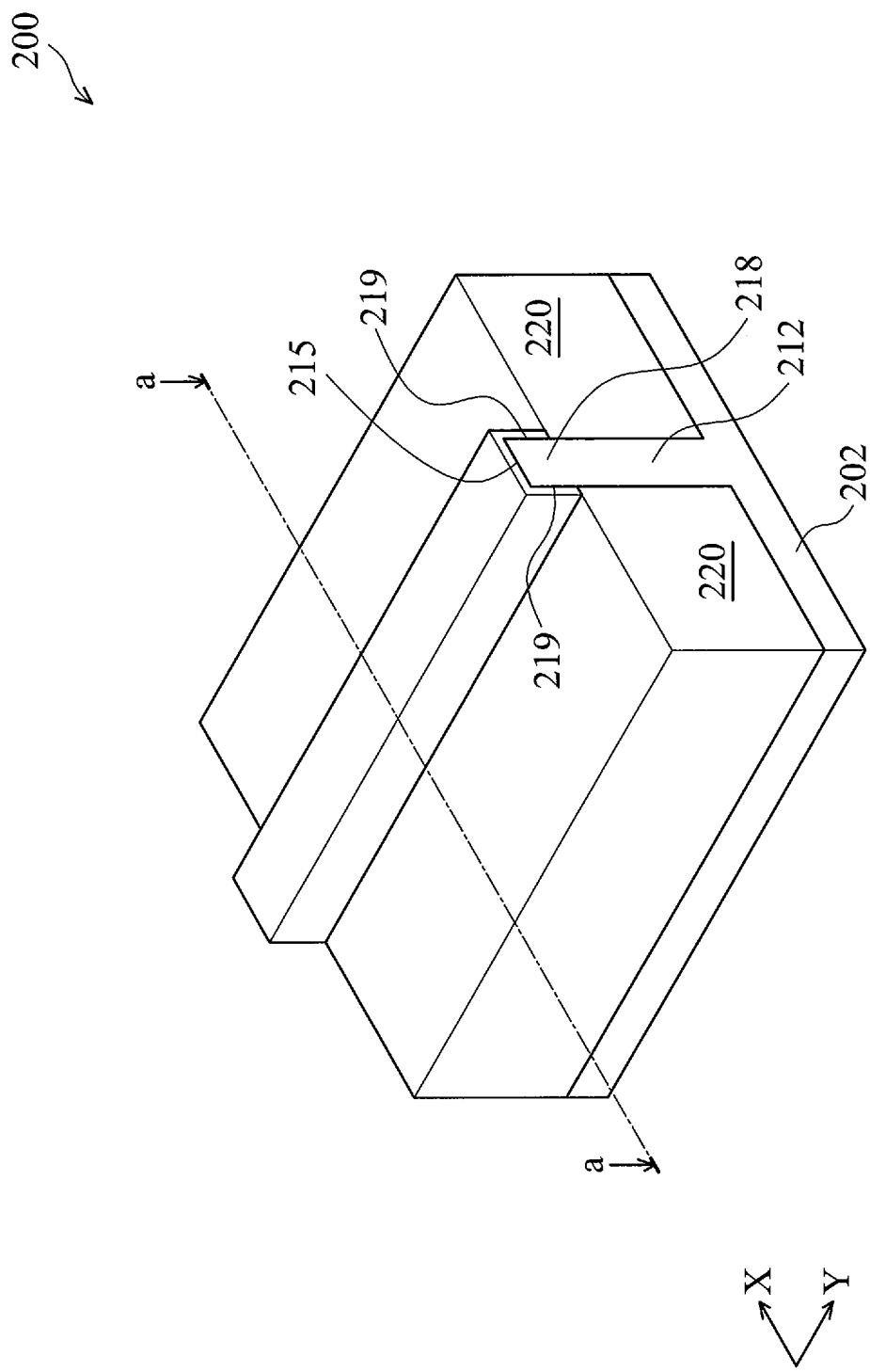
Figure 7B:
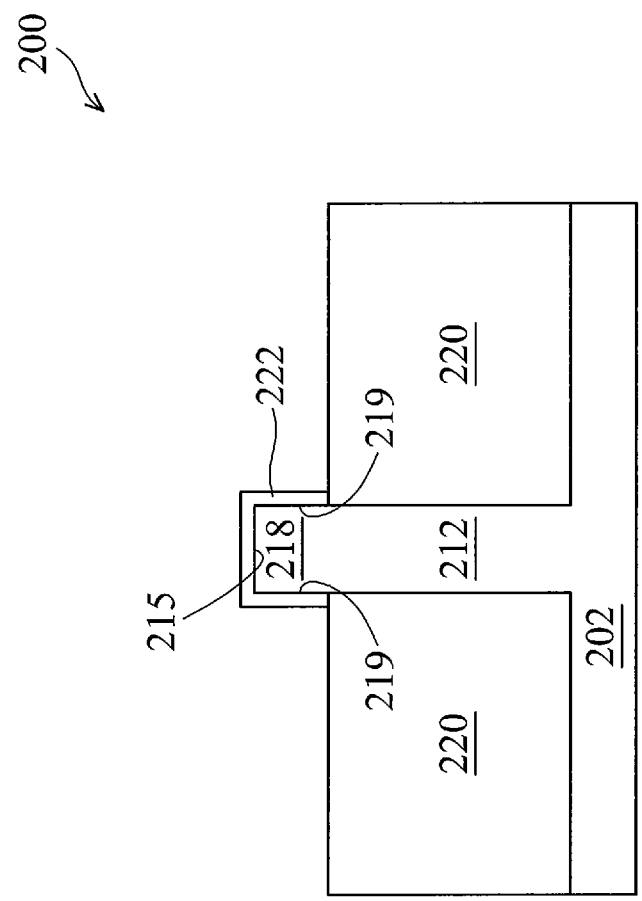

Corresponding to operation 112 of FIG. 1A, FIG. 7A is a perspective view of the FinFET 200 including an oxide layer 222 overlaying the upper fin 218 at one of the various stages of fabrication, according to some embodiments, and FIG. 7B is a cross-sectional view of the FinFET 200 taken along line a-a (along the X direction) of FIG. 7A. As shown, the oxide layer 222 is formed to extend along the sidewalls 219 and overlay the top surface 215 of the upper fin 218. In some embodiments, the oxide layer 220 may be formed by using a thermal oxidation process, an atomic layer deposition (ALD) process, a chemical vapor deposition (CVD) process, or the like. In the embodiments in which the upper fin 218 is formed of silicon, the oxide layer 220 may include silicon oxide.

Figure 8A:
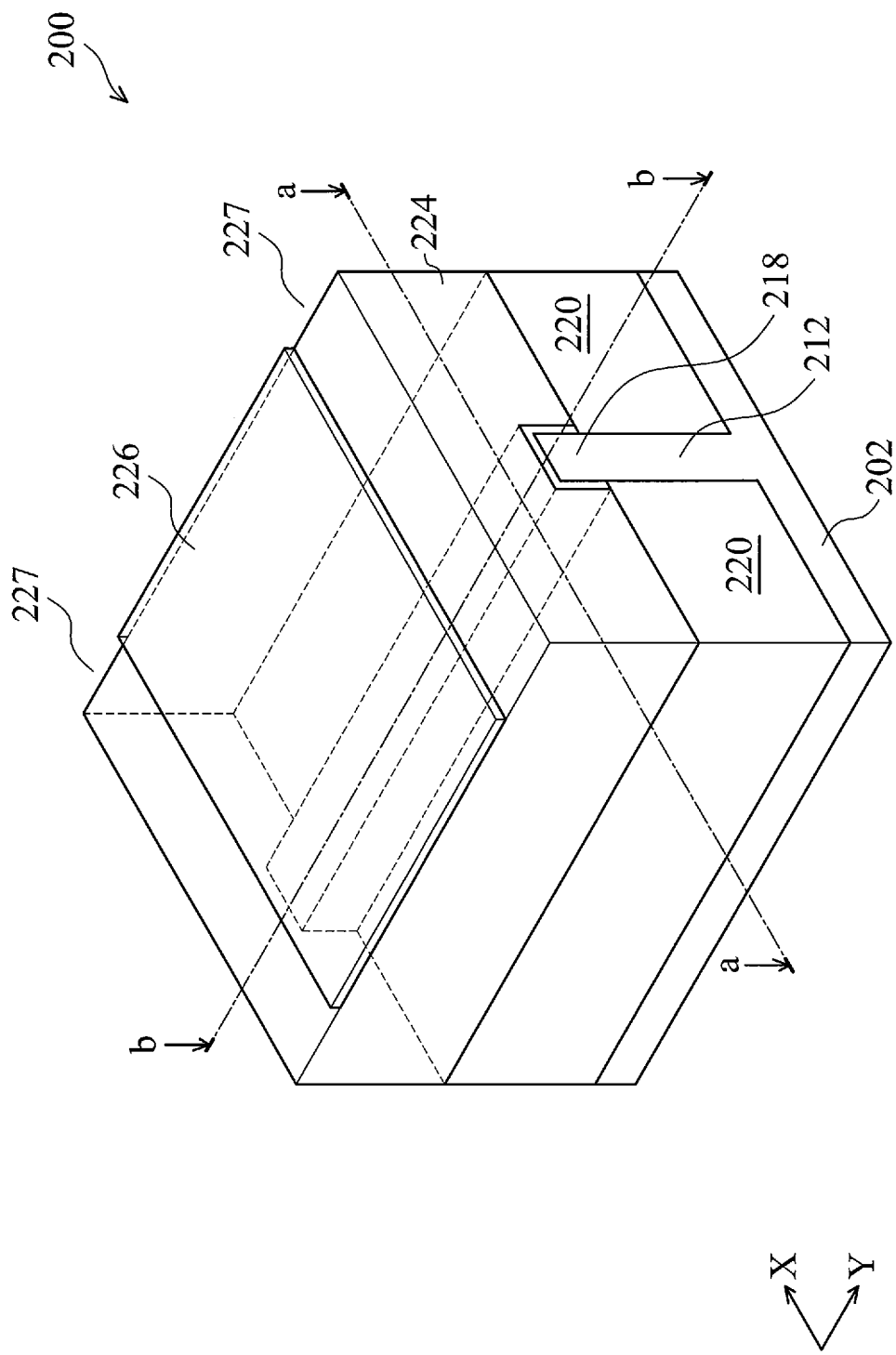
Figure 8B:
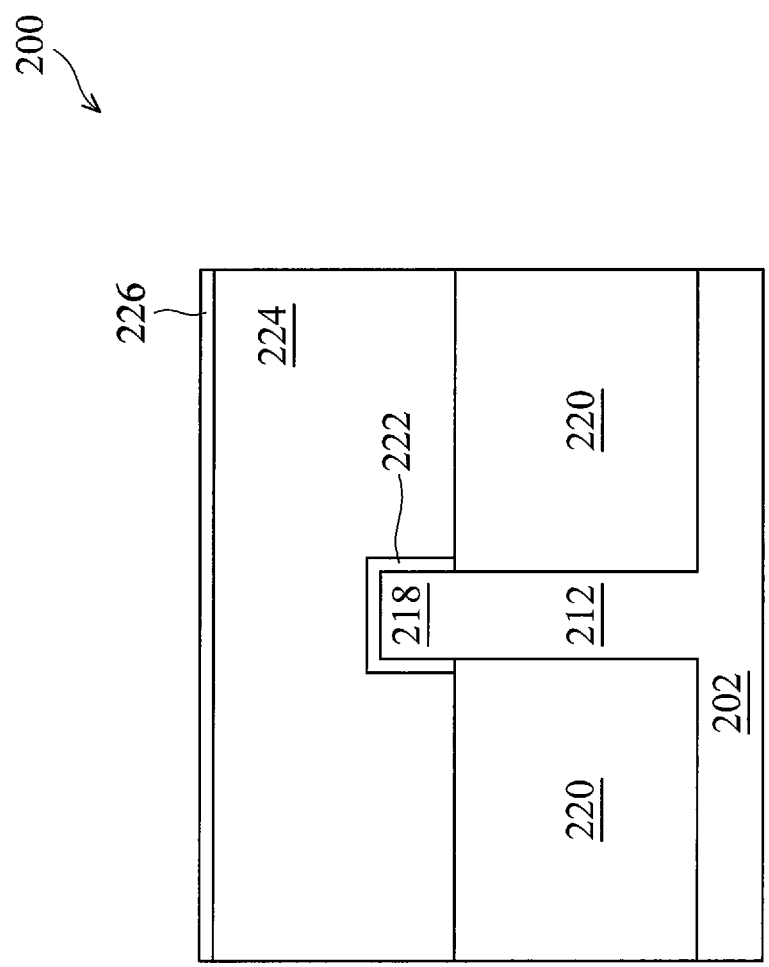
Figure 8C:
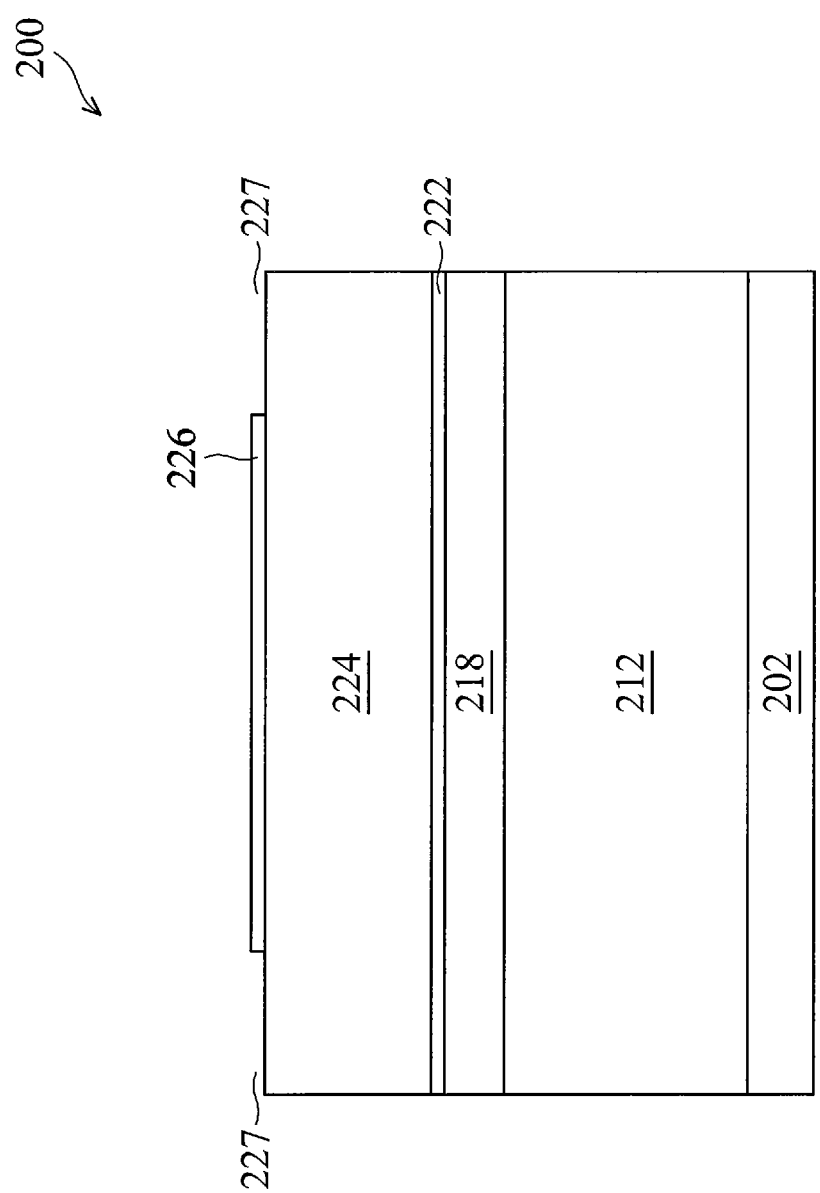
FIGS. 8C, 9C, 10C, 11C, 12C, 13C, and 14C illustrate corresponding cross-sectional views of FIGS. 8A, 9A, 10A, 11A, 12A, 13A, and 14A taken along a second direction, in accordance with some embodiments.

Corresponding to operation 114 of FIG. 1A, FIG. 8A is a perspective view of the FinFET 200 including a dummy poly layer 224 formed over the oxide layer 222 at one of the various stages of fabrication, according to some embodiments, FIG. 8B is a cross-sectional view of the FinFET 200 taken along line a-a (along the X direction) of FIG. 8A, and FIG. 8C is another cross-sectional view of the FinFET 200 taken along line b-b (along the Y direction) of FIG. 8A. As shown in FIG. 8A, the dummy poly layer 224 is formed to overlay the entire oxide layer 222 (and the upper fin 218 overlaid below), and, in some embodiments, is partially overlaid by a second mask layer 226 with a pattern. In the illustrated embodiment of FIG. 8A, such a pattern includes openings 227 at sides of the second mask layer 226, which is further shown in the cross-sectional view of FIG. 8C.

In some embodiments, the dummy poly layer 224 may comprise a polysilicon material. Further, the dummy poly layer 224 may be a polysilicon material doped with a uniform or non-uniform doping concentration. The dummy poly layer 224 may be formed using a suitable process such as ALD, CVD, physical vapor deposition (PVD), plating, or combinations thereof. In some embodiments, the second mask layer 226 may be substantially similar to the first mask layer 206. Accordingly, the second mask layer 226 may be formed of silicon nitride (SiN), silicon carbon nitride (SCN), silicon oxide nitride (SON), or the like, for example, using low-pressure chemical vapor deposition (LPCVD), plasma enhanced chemical vapor deposition (PECVD), or spin-on coating. More specifically, in some embodiments, after the second mask layer 226 (without the openings 227) is formed on the dummy poly layer 224, the second mask layer 226 is patterned to form the openings 227 by forming a patterned resist layer (not shown) on the second mask layer 226, and etching the second mask layer 226 using the patterned resist layer as an etching mask.

Figure 9A:
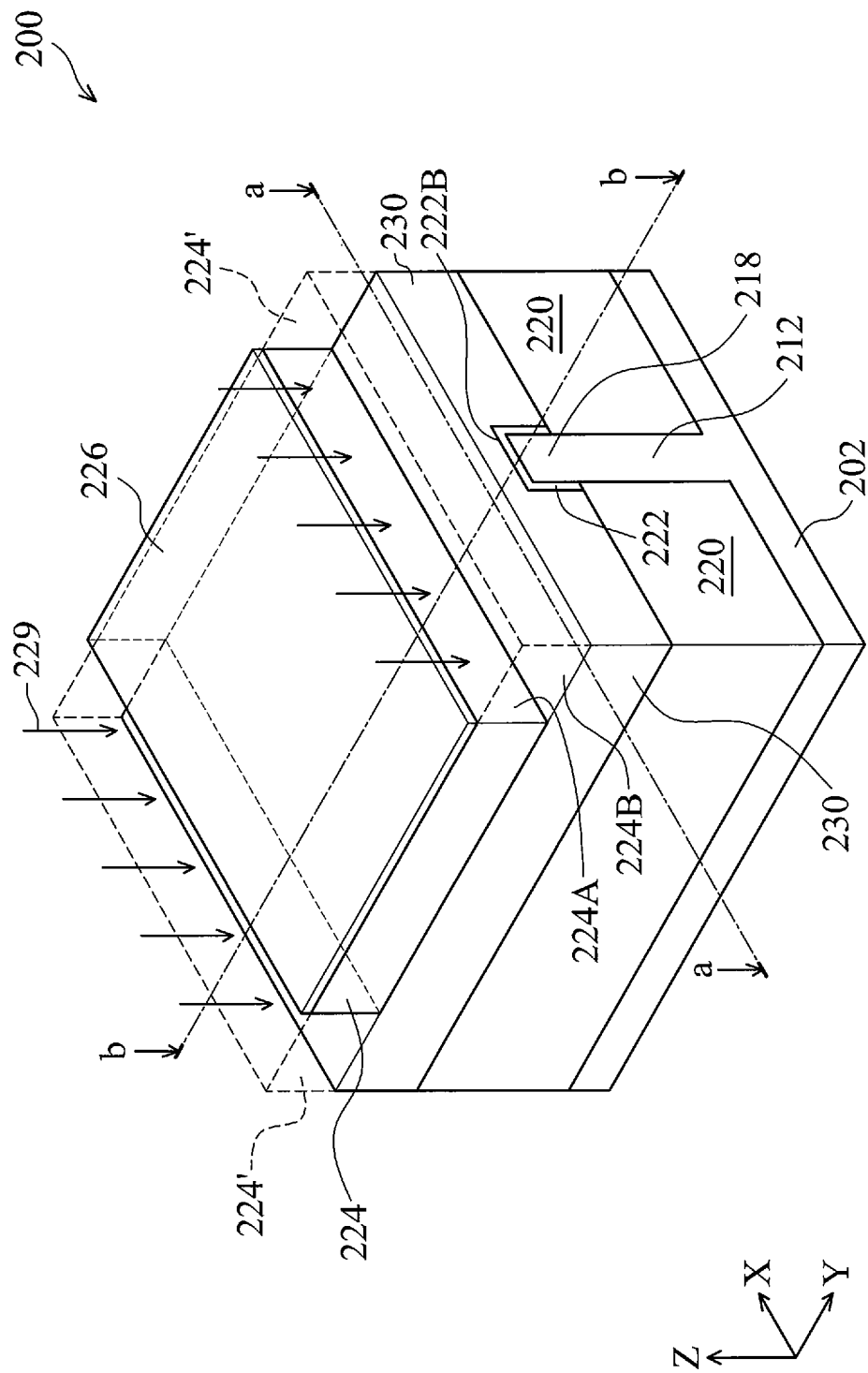
Figure 9B:
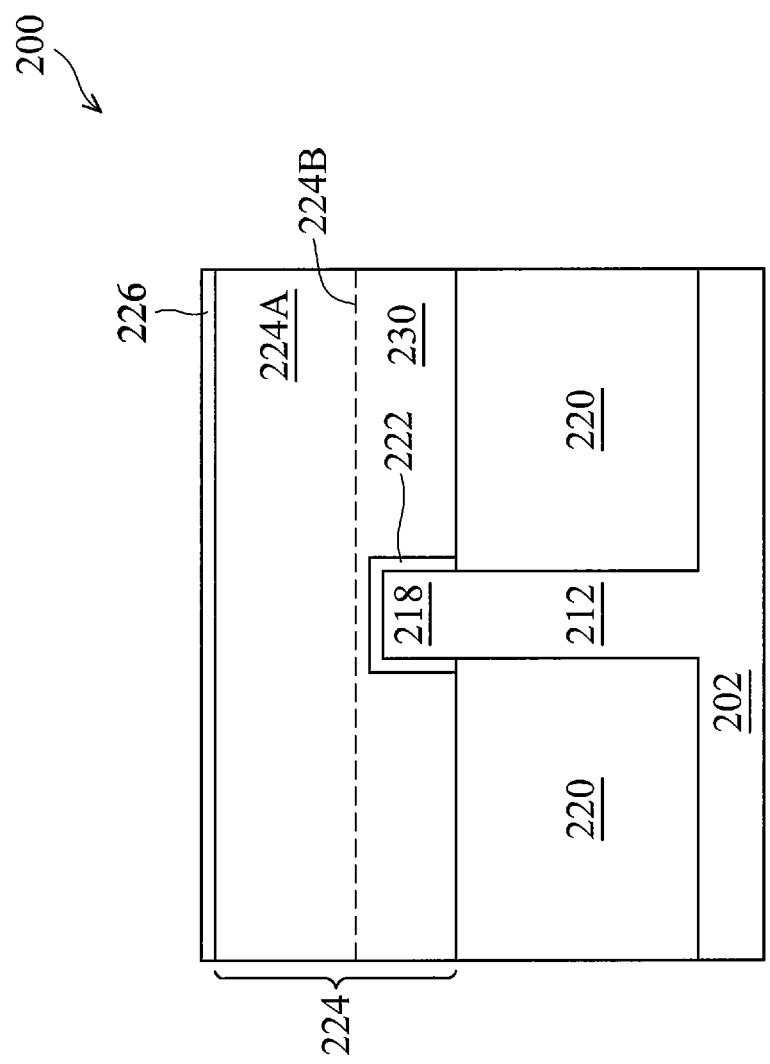
Figure 9C:
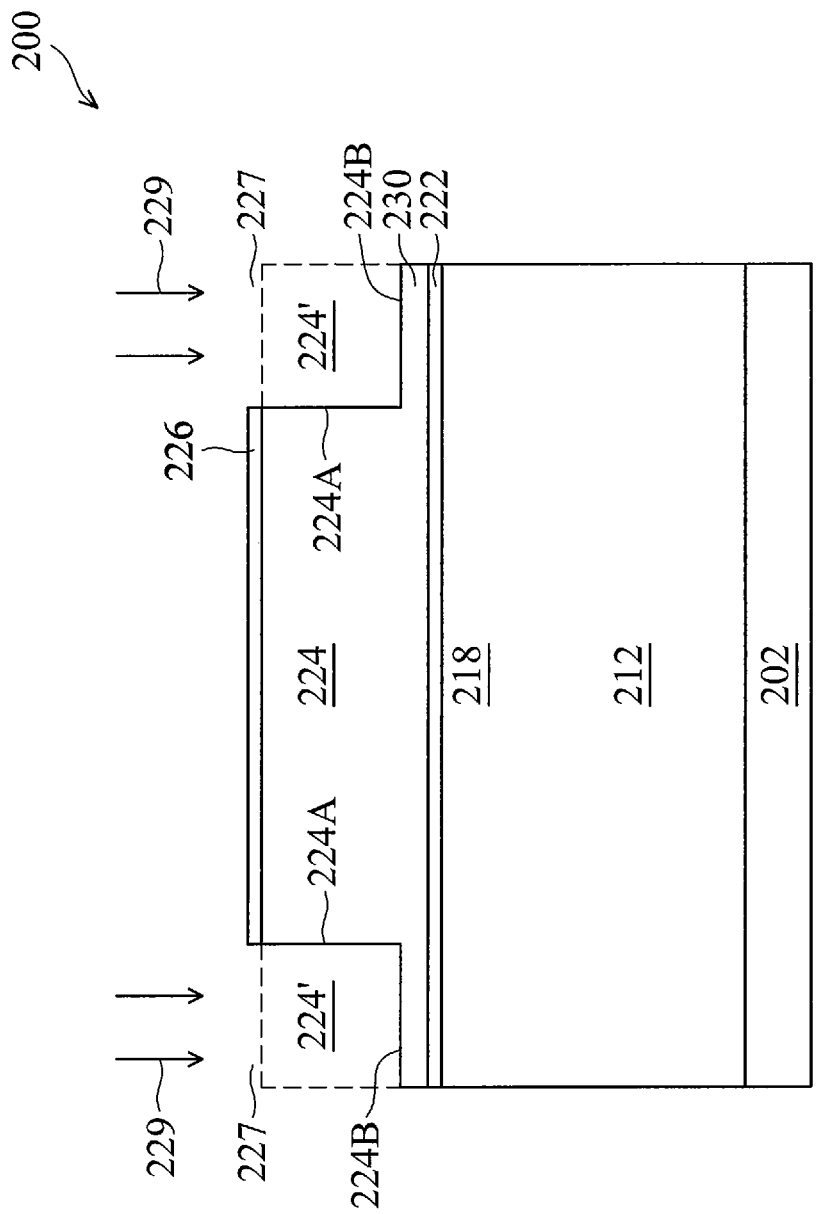

Corresponding to operation 116 of FIG. 1A, FIG. 9A is a perspective view of the FinFET 200 including upper side portions 224' (shown in dotted lines) of the dummy poly layer 224 being etched using a first etching process 229 at one of the various stages of fabrication, according to some embodiments, FIG. 9B is a cross-sectional view of the FinFET 200 taken along line a-a (along the X direction) of FIG. 9A, and FIG. 9C is another cross-sectional view of the FinFET 200 taken along line b-b (along the Y direction) of FIG. 9A.

In some embodiments, the upper side portions 224' may be vertically (along the Z direction) aligned with the openings 227 (FIGS. 8A and 8C) of the second mask layer 226. Accordingly, when the first etching process 229, which is an anisotropic (e.g., along the reversed Z direction) etching process, is applied to the dummy poly layer 224 through the openings 227 (i.e., using the second mask layer 226 as an etching mask), the first etching process 229 can follow the respective openings 227 to vertically etch away the upper side portions 224'. More specifically, as shown in FIGS. 9A and 9C, after the upper side portions 224' are respectively etched away, sidewalls 224A and intermediate surfaces 224B of the dummy poly layer 224 are respectively exposed at sides of the dummy poly layer 224, wherein the intermediate surfaces 224B may be substantially adjacent to, yet higher than, a top surface 222A of the oxide layer 222. In some embodiments, the intermediate surface 224B may be a "top" surface of a lower side portion 230 of the dummy poly layer 224.

In some embodiments, the first etching process 229 includes a dry etching process. More specifically, such a dry etching process of the first etching process 229 includes using a plasma of reactive gas that is selected from: fluorocarbons ($CF_4$), hydrogen bromide (HBr), chlorine ($Cl_2$), oxygen (O), nitrogen (N), argon (Ar), helium (He), or a combination thereof. As mentioned above, the first etching process 229 includes a substantially vertical etching process that etches the upper side portions 224' through the openings 227, respectively. In some embodiments, the first etching process 229 may be stopped, manually or automatically (through an etching recipe), when the bottom surface 224B of the dummy poly layer 224 is substantially close to the top surface 222A of the oxide layer 222.

Figure 10A:
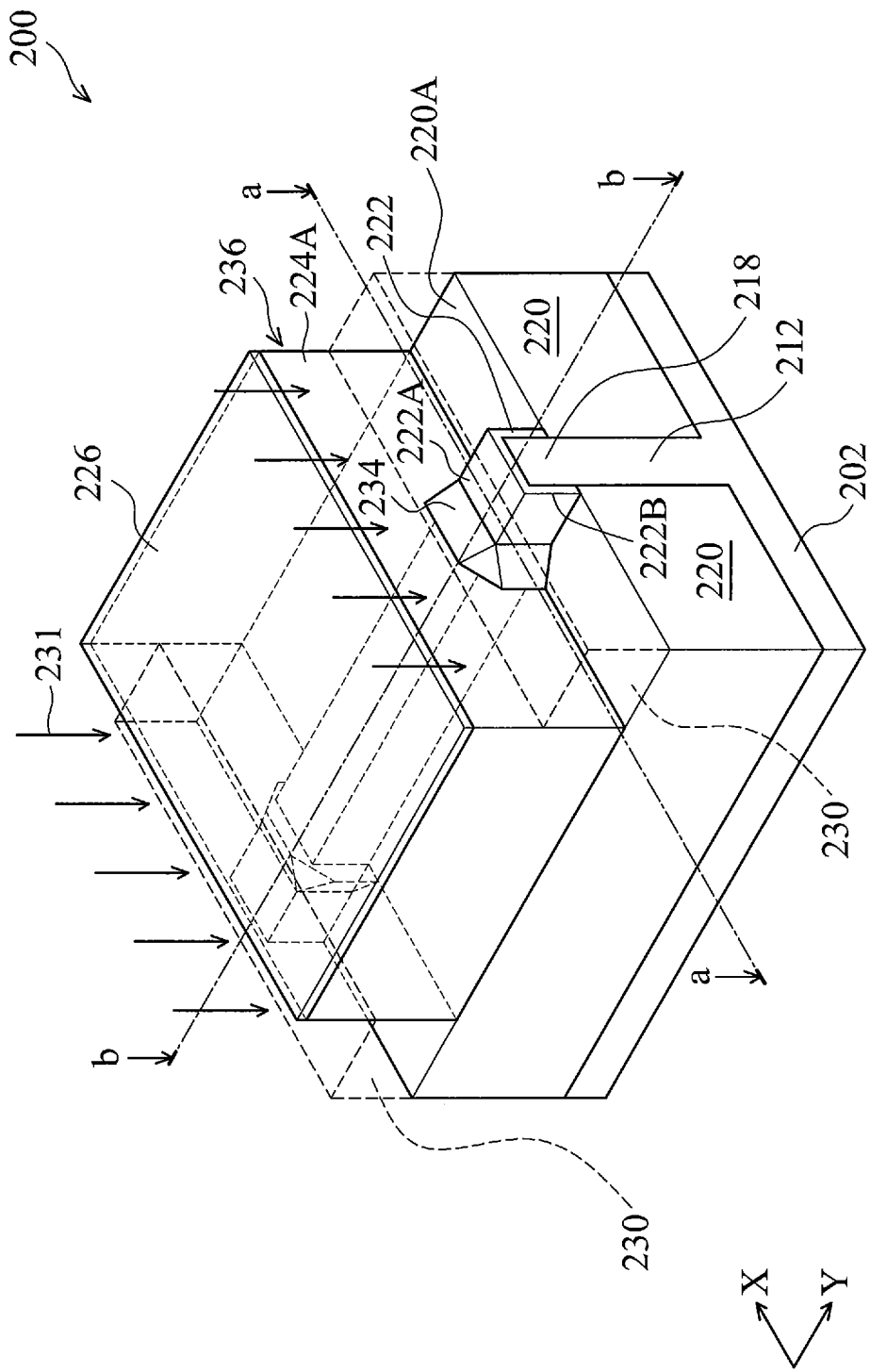
Figure 10B:
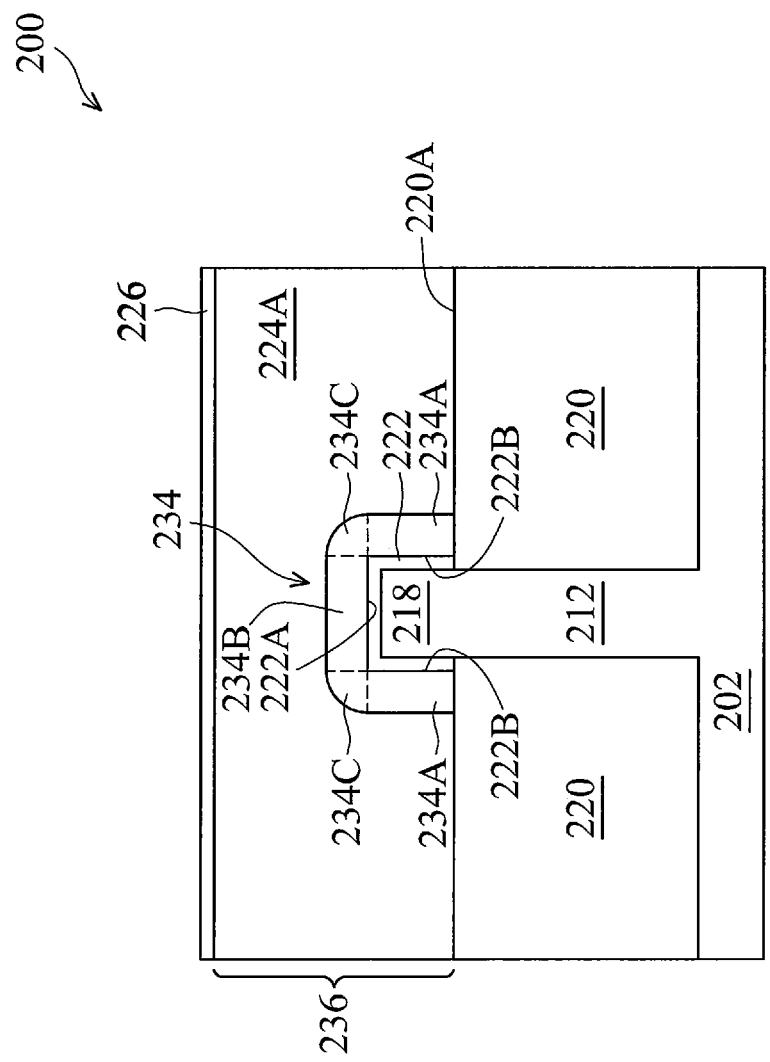
Figure 10C:
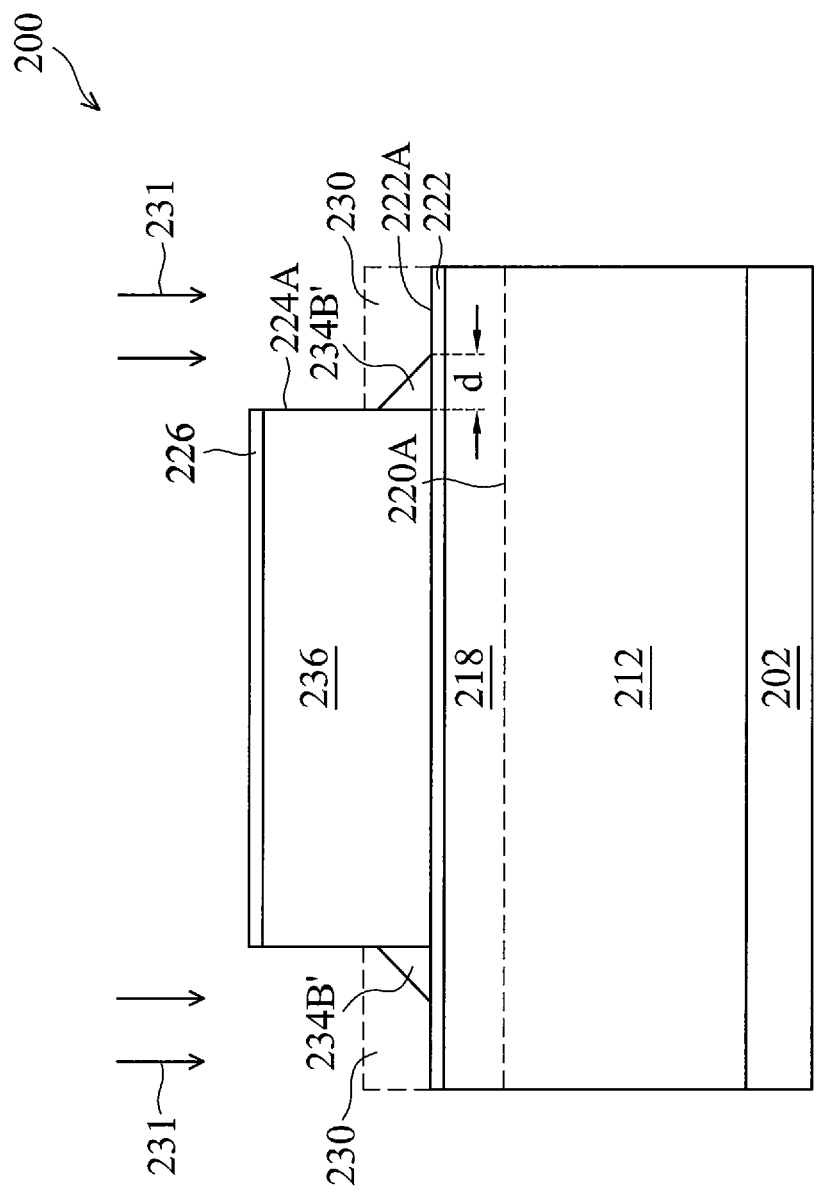
Figure 10D:
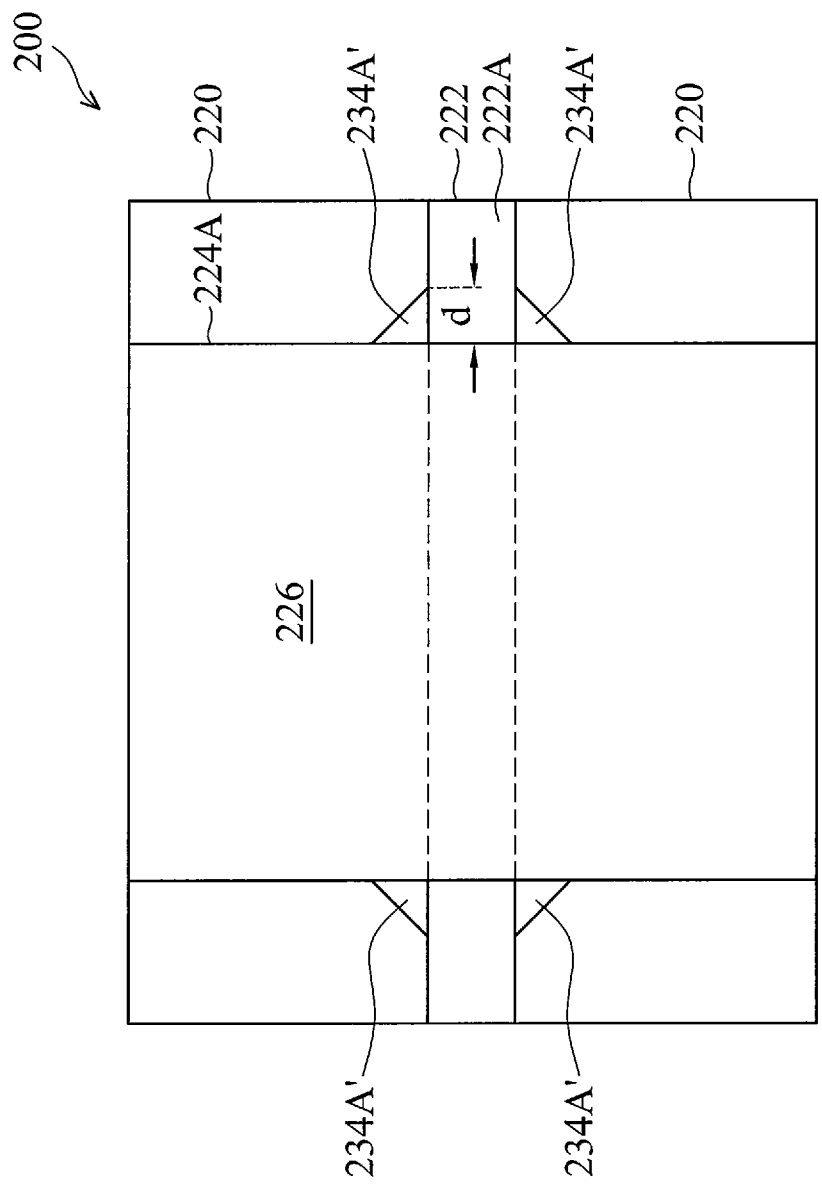
FIG. 10D illustrates a corresponding top view of FIG. 10A in accordance with some embodiments.

Corresponding to operation 118 of FIG. 1B, FIG. 10A is a perspective view of the FinFET 200 including a pair of poly footing features 234 that are formed using a second etching process 231 and 232? to etch lower side portions 230 of the dummy poly layer 224 at one of the various stages of fabrication, according to some embodiments, FIG. 10B is a cross-sectional view of the FinFET 200 taken along line a-a (along the X direction) of FIG. 10A, FIG. 10C is another cross-sectional view of the FinFET 200 taken along line b-b (along the Y direction) of FIG. 10A, and FIG. 10D is a top view of the FinFET 200.

As shown in FIG. 10A, the pair of poly footing features 234 are each formed as a continuous arch-shaped structure with the upper fin 218 and the oxide layer 222 penetrating therethrough. In some embodiments, the poly footing features 234 are formed as part of a remaining dummy poly layer 236 that protrudes beyond the sidewall 224A of the dummy poly layer 224. Thus, the poly footing feature 234 is still in contact with the sidewall 224A (of the remaining dummy poly layer 236 now). More specifically, in addition to be in contact with the sidewall 224A, such an arch-shaped poly footing feature 234 is formed to surround part of the top surface 222A and part of sidewalls 222B of the oxide layer 222 so as to cause respective end portions of the top surfaces 222A and the sidewalls 222B of the oxide layer 222 to be exposed, which will be discussed in further detail below.

Referring now to FIG. 10B, each of the poly footing features 234 may include three portions: vertical portions 234A that each extends along part of the respective sidewall 222B of the oxide layer 222; a horizontal portion 234B that overlays the top surface 222A of the oxide layer 222; and jointing portions 234C that each joints the horizontal portion 234B and one of the vertical portions 234A, in accordance with some embodiments. And as mentioned above, the poly footing feature 234 is in contact with the sidewall 224A so that each of the above-described three portions of the poly footing feature 234 is at least in contact with the sidewall 224A. For example, the vertical portion 234A is in contact with the sidewall 224A and further with part of the sidewall 222B; the horizontal portion 234B is in contact with the sidewall 224A and further with part of the top surface 222A; and the jointing portion 234C is in contact with sidewall 224A.

Accordingly, in some embodiments, since the vertical portion 234A and the horizontal portion 234B of the poly footing feature 234 are in contact with at least two surfaces (e.g., the sidewall 224A and either the top surface 222A or the sidewall 222B), the vertical portion 234A and the horizontal portion 234B may be each formed to have a respective cross-section as a right triangle shape. For example, as shown in FIG. 10C, the horizontal portion 234B has its respective cross-section 234B' as a right triangle with two legs in contact with the sidewall 224A and the top surface 222A, respectively; and, as shown in FIG. 10D, the vertical portion 234A has its respective cross-section 234A' as a right triangle with two legs in contact with the sidewall 224A and the sidewall 222B, respectively.

In contrast to the first etching process 229 (FIG. 9A) that has a substantially anisotropic (vertical) etching process, the second etching process 231 may include an initial etching process, which is milder than the first etching process 229, and end by a less anisotropic post treatment. In some embodiments, the initial etching process of the second etching process 231 includes using the plasma of reactive gas used in the first etching process 229 (e.g., HBr, $CF_4$, $Cl_2$, O, N, Ar, He, or a combination thereof) with a lower bias voltage and under a higher pressure. By modifying the bias voltage and pressure during the second etching process 231, respective ion energies of the respective reactive gases (e.g., HBr, CF, O, N, Ar, He, or a combination thereof) may be changed accordingly so that the initial etching process of the second etching process 231 may become milder. As mentioned above, in some embodiments, the less anisotropic post treatment may include adjusting $Cl_2$ flow rate to modify respective gas (molar) ratios of the reactive gases (e.g., HBr, $CF_4$, $Cl_2$, O, N, Ar, He, or a combination thereof) so as to make the second etching process 231 less anisotropic.

By using such an etching process 231 to etch the lower side portions 230 (shown as dotted lines in FIGS. 10A and 10C) of the dummy poly layer 224 while still using the second mask layer 226 as the etching mask, the poly footing feature 234 may be formed as the continuous arch-structure at interfaces of the sidewall 224A and the top surface 222A/sidewall 222B so as to expose the end portions of the top surfaces 222A and the sidewalls 222B, as described above, and a top surface 220A of the isolation feature 220 (FIG. 10A). In particular, according to some embodiments, the poly footing feature 234 may protrude from the sidewall 224A of the remaining dummy poly layer 236 toward the end portions of the oxide layer 222 and the upper fin 218 by a distance "d" of about 2 nanometers (nm) or longer, which is shown in FIGS. 10C and 10D.

Figure 11A:
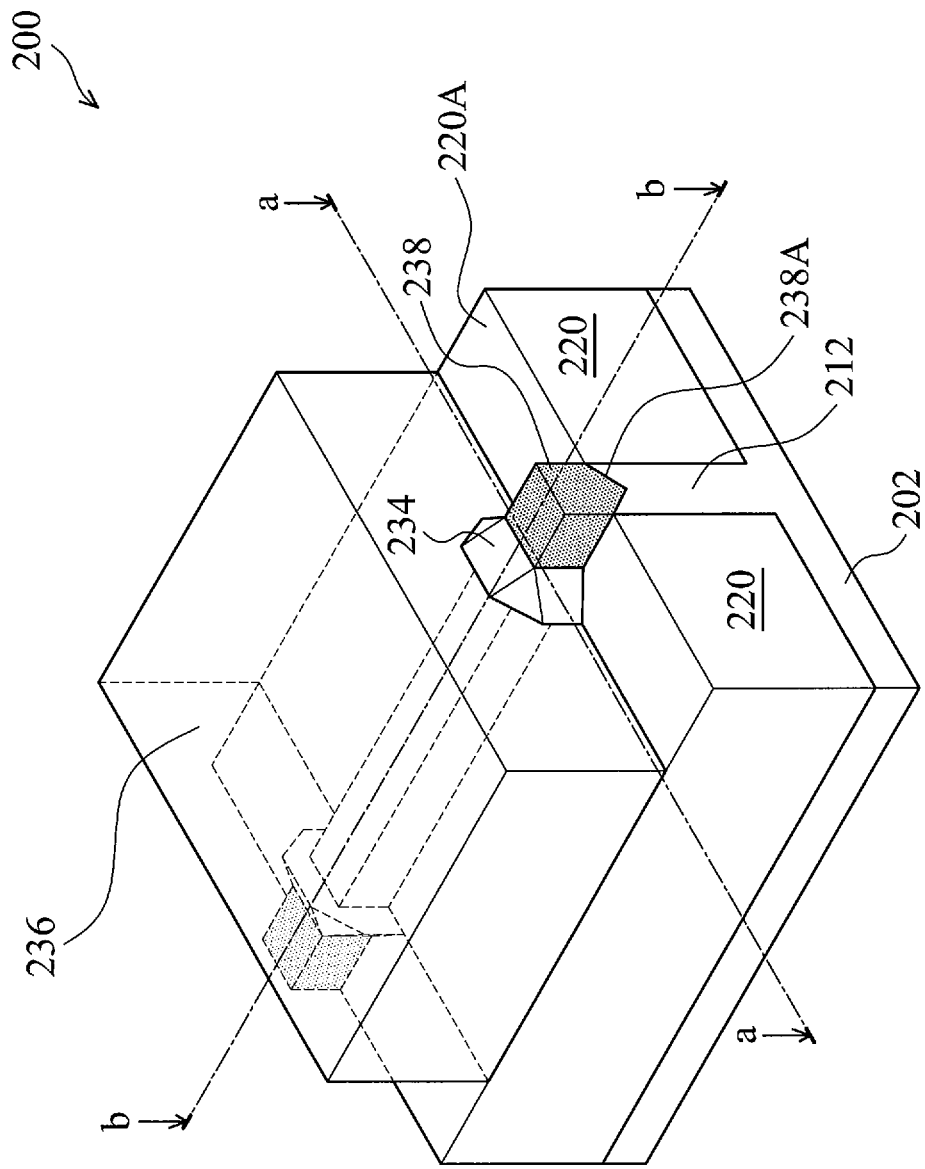
Figure 11B:
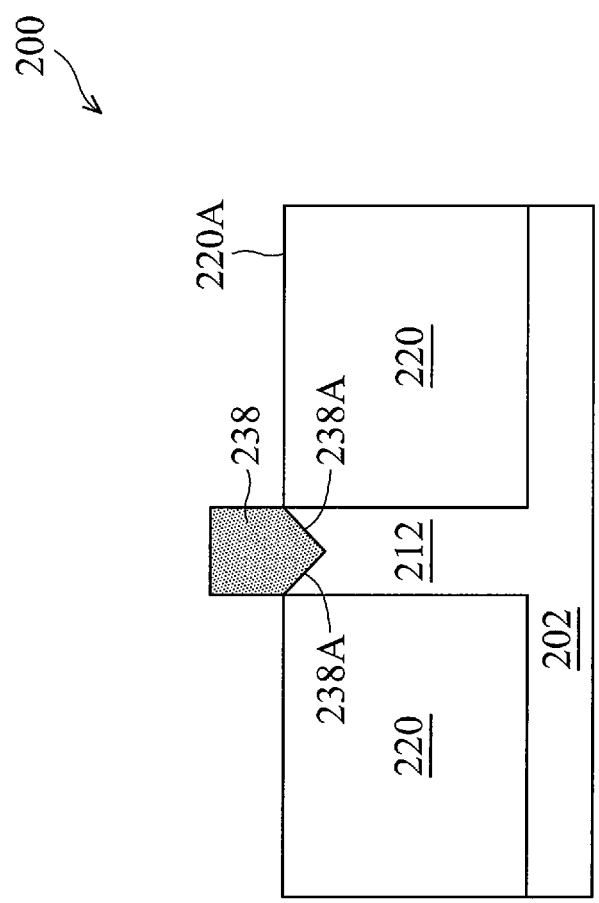
Figure 11C:
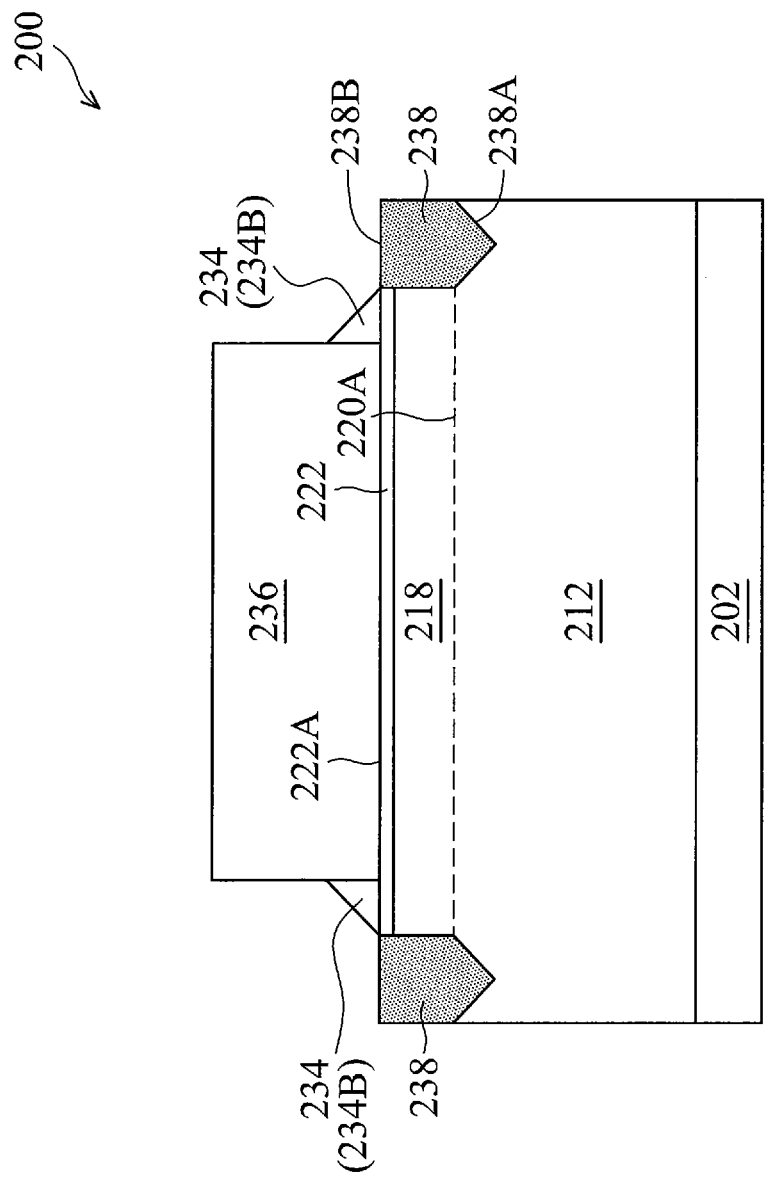

Corresponding to operation 120 of FIG. 1B, FIG. 11A is a perspective view of the FinFET 200 including source/drain (S/D) features 238 that are respectively formed at sides of the poly footing features 234 one of the various stages of fabrication, according to some embodiments, FIG. 11B is a cross-sectional view of the FinFET 200 taken along line a-a (along the X direction) of FIG. 11A, and FIG. 11C is another cross-sectional view of the FinFET 200 taken along line b-b (along the Y direction) of FIG. 11A. It is noted that the line a-a of FIG. 11A is taken across one of the S/D features 238.

In some embodiments, the S/D features 238 are respectively formed on end portions of the fin 212 that are not covered by the remaining dummy poly layer 236, i.e., the portions of the fin 212 that are covered by the exposed end portions of the oxide layer 222. In some embodiments, the respective end portions of the oxide layer 222 and the end portions of the upper fin 218 are removed before the formation of the S/D features 238. The formation of the S/D feature 238 will be briefly described below. In some embodiments, the end portions of the oxide layer 220 that are not covered by the remaining dummy poly layer 236 are removed by one or more selective wet/dry etching processes, and the end portions of the upper fin 218 are removed by one or more other selective wet/dry etching processes so as to form respective recesses (not shown) on the sides of the remaining dummy poly layer 236. In some embodiments, each recess has a bottom surface 238A. Such a recess may extend downwardly beneath the top surface 220A of the isolation feature 220, i.e., the bottom surface 238A is vertically lower than the top surface 220A. Subsequently, the S/D features 238 are epitaxially grown from the fin 212 by using a low-pressure chemical vapor deposition (LPCVD) process and/or a metal-organic chemical vapor deposition (MOCVD) process. It is noted that each S/D feature 238 is grown to has a top surface 238B (FIG. 11C) that may be approximately aligned with the top surface 222A of the oxide layer 222. In some alternative embodiments, the top surface of 238B the S/D feature 238 may be lower or higher than the top surface 222A while remaining within the scope of the present disclosure.

Figure 12A:
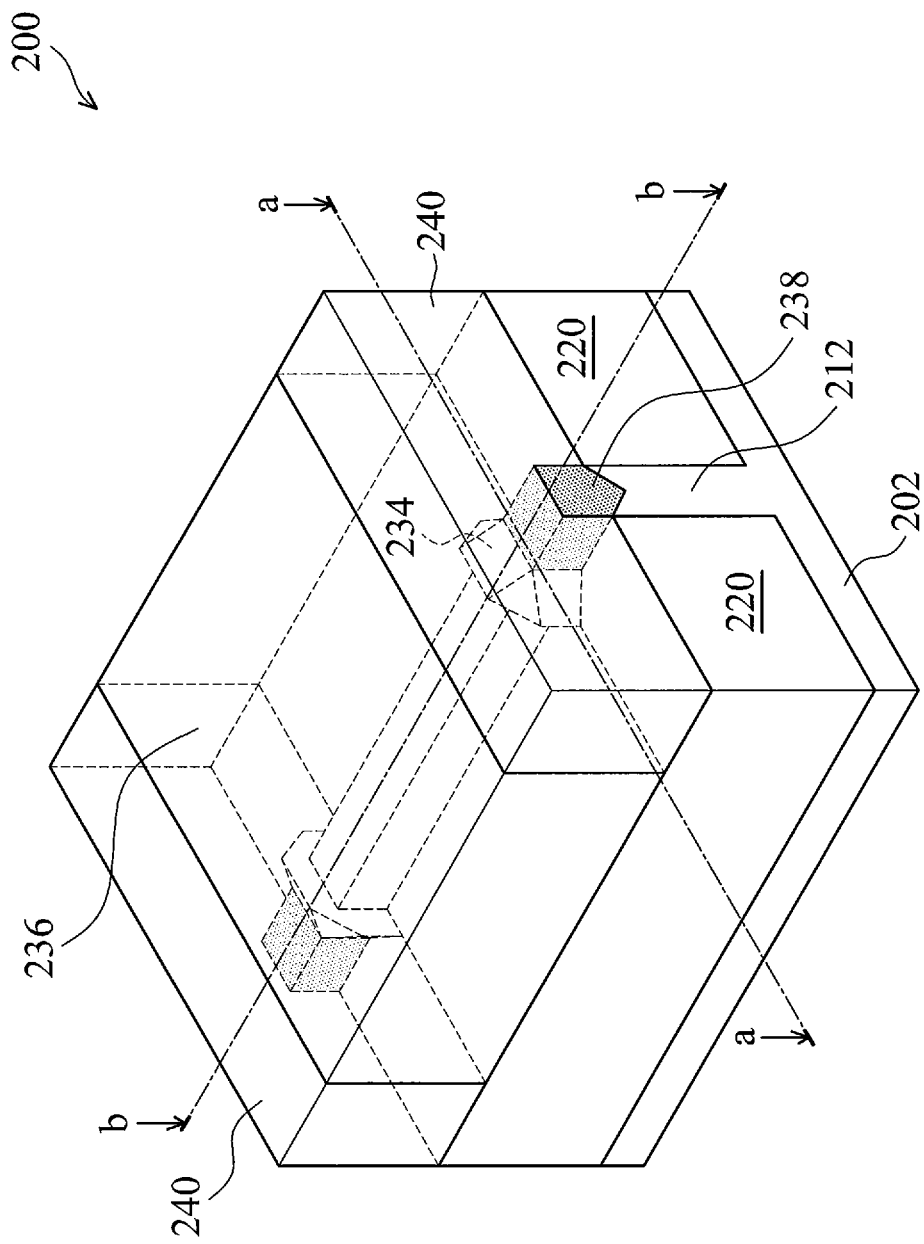
Figure 12B:
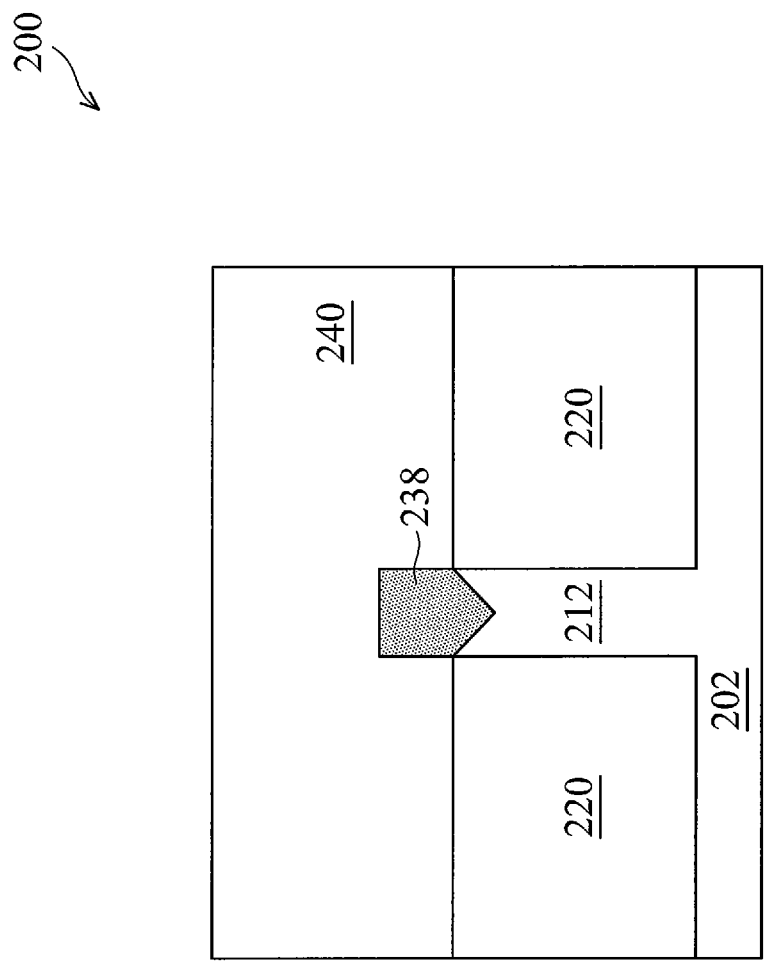
Figure 12C:
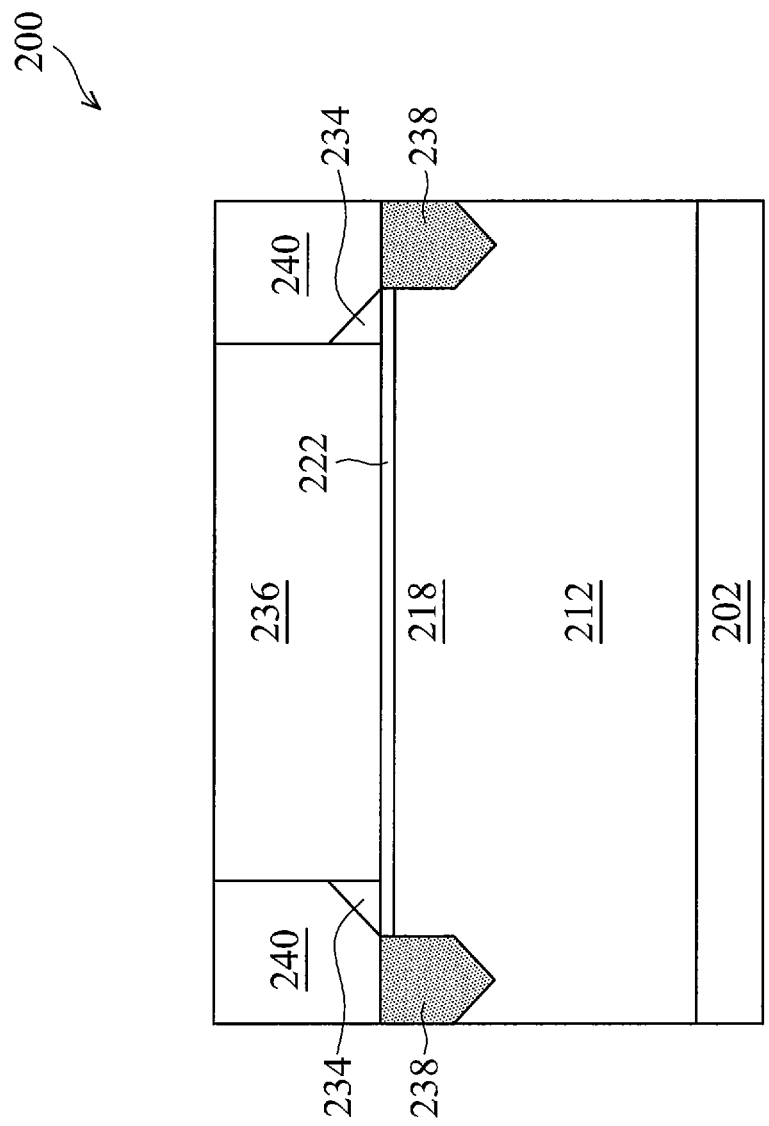

Corresponding to operation 122 of FIG. 1B, FIG. 12A is a perspective view of the FinFET 200 including a second dielectric layer 240 that is formed to overlay the poly footing feature 234 and the S/D feature 238 at one of the various stages of fabrication, according to some embodiments, FIG. 12B is a cross-sectional view of the FinFET 200 taken along line a-a (along the X direction) of FIG. 12A, and FIG. 12C is another cross-sectional view of the FinFET 200 taken along line b-b (along the Y direction) of FIG. 12A. Similar to FIG. 11A, the line a-a of FIG. 12A is also taken across one of the S/D features 238.

According to some embodiments, the second dielectric layer 240 is formed to overlay the poly footing feature 234 and the S/D feature 238 (as further shown in FIGS. 12B and 12C) so as to protect the S/D features 238 during a later process to remove the remaining dummy poly layer 236 (including the poly footing feature 234), which will be discussed below. Such a second dielectric layer 240 may include a material that is selected from at least one of: silicon oxide, a low dielectric constant (low-k) material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the second dielectric layer 240 may be referred to as an inter-layer dielectric (ILD).

Figure 13A:
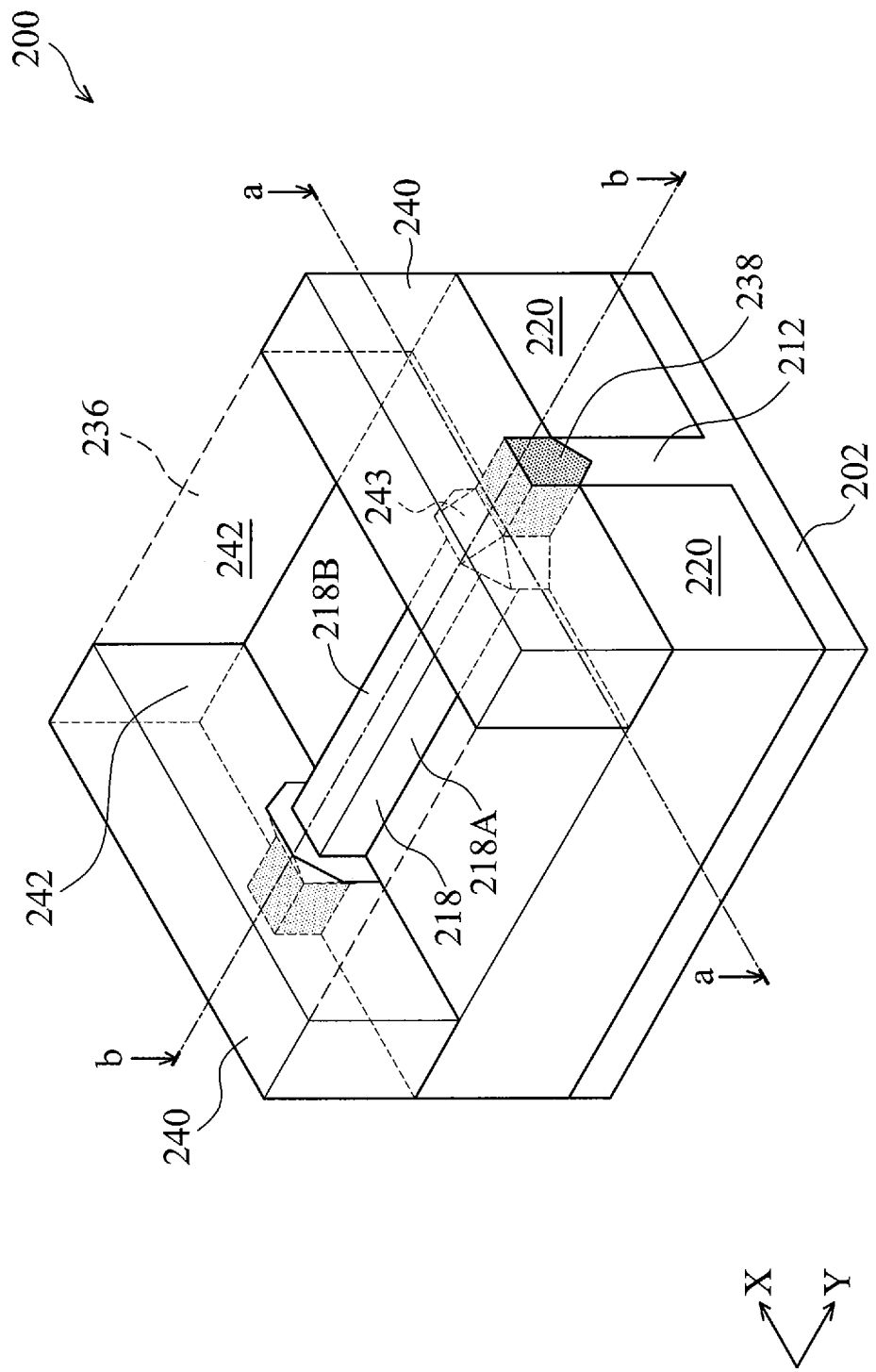
Figure 13B:
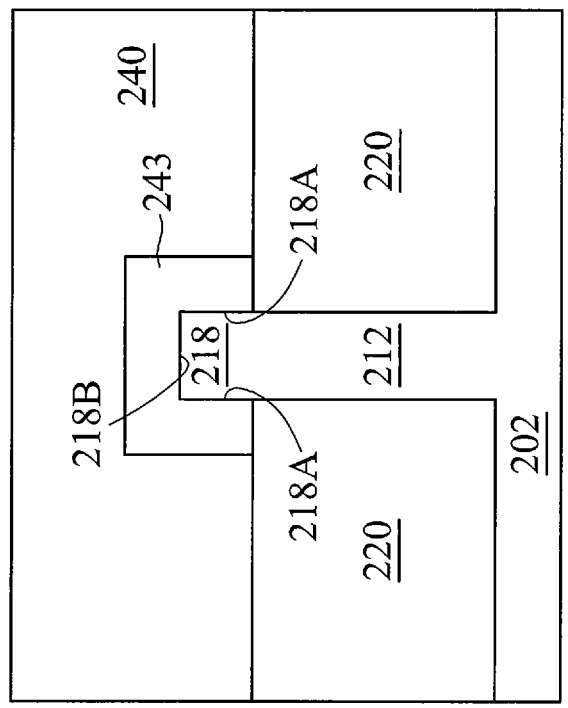
Figure 13C:
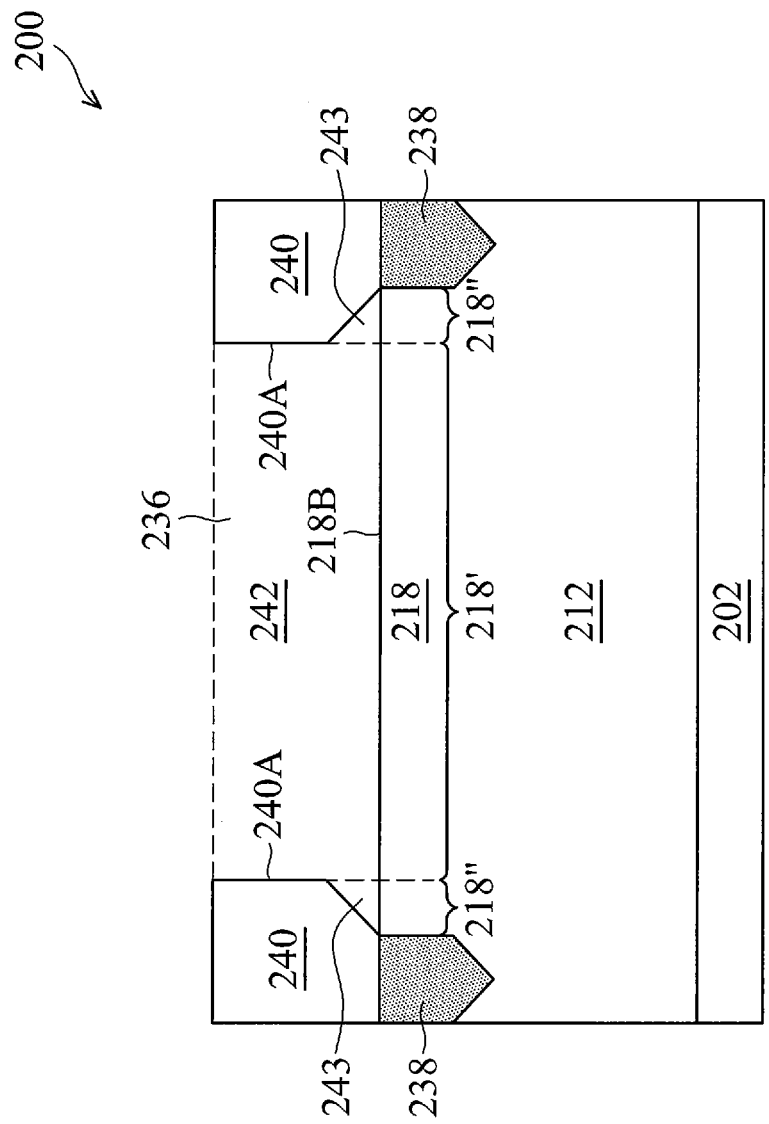

Corresponding to operation 124 of FIG. 1B, FIG. 13A is a perspective view of the FinFET 200 including the remaining dummy poly layer 236 (and the poly footing feature 234) being removed so as to form a void 242 with horizontally extended cavities 243 at a bottom of the void 242 at one of the various stages of fabrication, according to some embodiments, FIG. 13B is a cross-sectional view of the FinFET 200 taken along line a-a (along the X direction) of FIG. 13A, and FIG. 13C is another cross-sectional view of the FinFET 200 taken along line b-b (along the Y direction) of FIG. 13A. It is noted the line a-a of FIG. 13A is taken across one of the removed poly footing features 234. Further, the removed remaining dummy poly layer 236 is shown in dotted lines in FIG. 13A.

As further shown in FIG. 13C, after the remaining dummy poly layer 236 is removed, a void 242 is formed between the second dielectric layer 240. In some embodiments, the void 240 includes horizontally extended cavities 243 that are located at inner lower portions of the second dielectric layer 240 (i.e., sidewalls of the void 242), respectively. An inner side of the second dielectric layer 240 may be referred to as the side having a sidewall 240A, wherein the sidewalls 240A of the second dielectric layers 240 face to each other. As such, the extended cavity 243 may be formed as a respective undercut of the second dielectric layer 240 (hereinafter "undercut 243").

Referring still to FIG. 13C, in some embodiments, after the removal of the remaining dummy poly layer 236, in addition to sidewalls 218A and an upper surface 218B at a central portion of the upper fin 218 (i.e., the portion of the upper fin 218 that is between vertical projections of the respective sidewalls 240A) being exposed, the sidewalls 218A and upper surface 218B that are outside the central portion of the upper fin 218 (i.e., the respective portions of the upper fin 218 that are outside the vertical projections of the sidewalls 240A and under the undercuts 243) are exposed. For purposes of brevity, the central portion of the upper fin 218 inside the vertical projections of the sidewalls 240A is referred to as central portion 208', and the portions of the upper fin 218 outside the vertical projections of the sidewalls 240A (i.e., under the undercuts 243) are referred to as side portions 218" of the upper fin 218 in the following discussions. Since the undercut 243 follows the shape of the removed poly footing feature 234, as further shown in FIG. 13B, the undercut 243 is also formed to surround the sidewalls 218A and upper surface 218B of the side portions 218" of the upper fin 218, or the oxide layer 222, depending on whether the oxide layer 222 is removed, which will be discussed below.

In some embodiments, the remaining dummy poly layer 236 may be removed (etched) by one or more selective dry and/or wet etching processes until a central portion of the oxide layer 222 is exposed. More specifically, in some embodiments, the wet etching process to remove the remaining dummy poly layer 236 includes using diluted hydrofluoric acid (DHF), and/or an amine derivative etchant (e.g., $NH_4OH$, $NH_3(CH_3)OH$, TetraMethyl Ammonium Hydroxide (TMAH), etc.); and the dry etching process to remove the remaining dummy poly layer 236 includes using a plasma of reactive gas that is selected from: fluorocarbons, oxygen, chlorine, boron trichloride, nitrogen, argon, helium, or a combination thereof.

As described in operation 126 of FIG. 1B, the oxide layer 222 may be optionally removed. In the illustrated embodiment of FIGS. 13A-13C (and the following figures), after the remaining dummy poly layer 236 is removed, the oxide layer 222 is subsequently removed by one or more selective wet etching processes until the central portion 218' of the upper fin 218 that was covered by the remaining dummy poly layer 236 and the oxide layer 222 is exposed. More specifically, in some embodiments, the wet etching process to remove the oxide later 222 includes using diluted hydrofluoric acid (DHF), and/or an amine derivative etchant (e.g., NH$_4$OH, NH$_3$(CH$_3$)OH, TetraMethyl Ammonium Hydroxide (TMAH), etc.

Figure 14A:
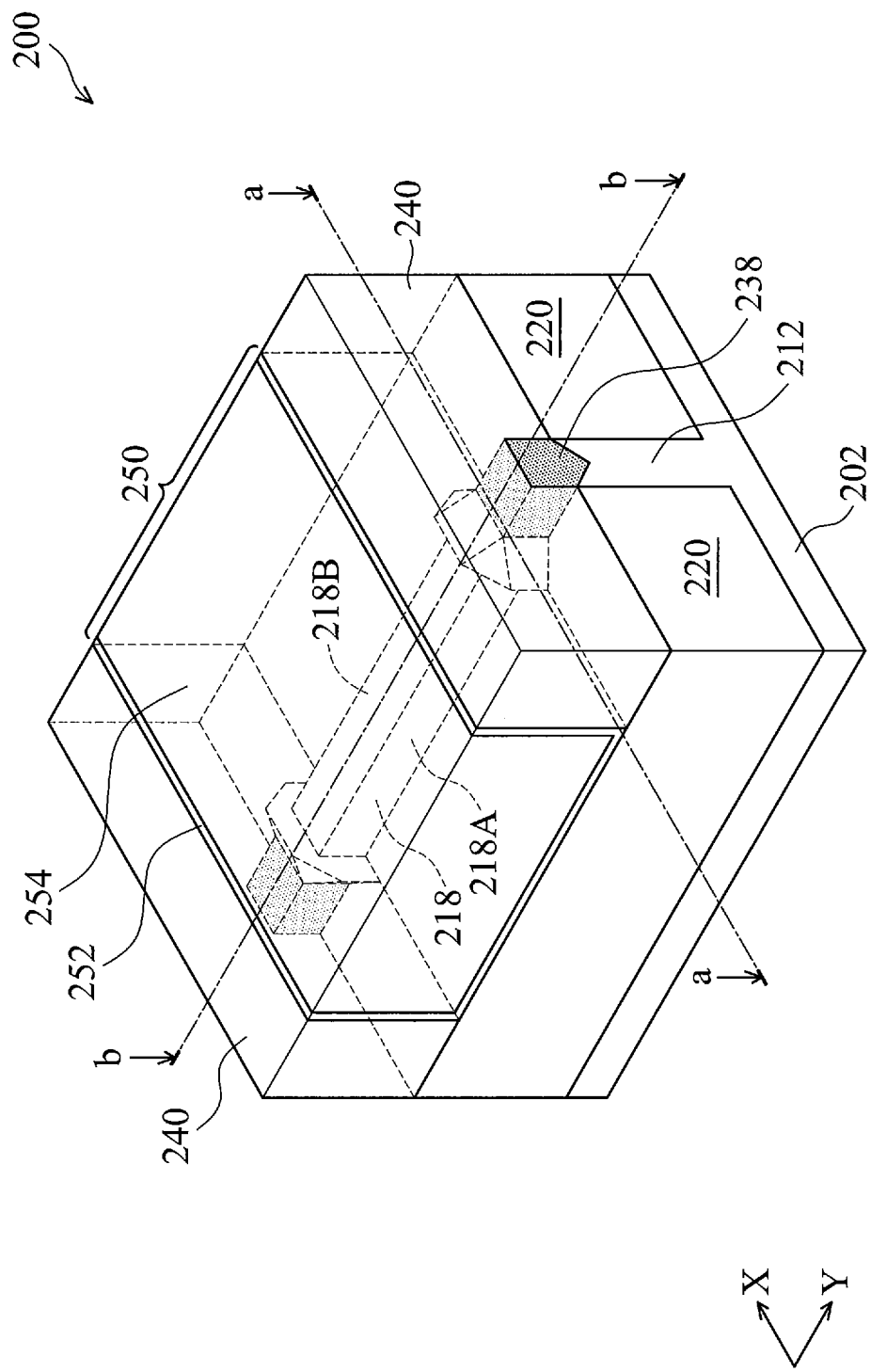
Figure 14B:
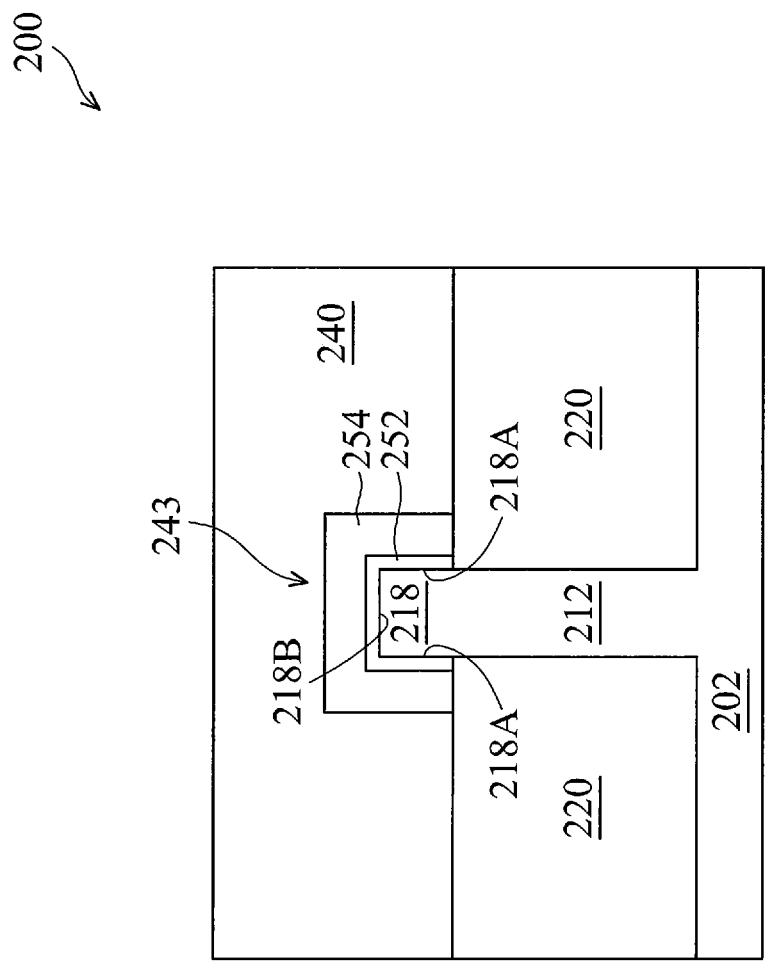
Figure 14C:
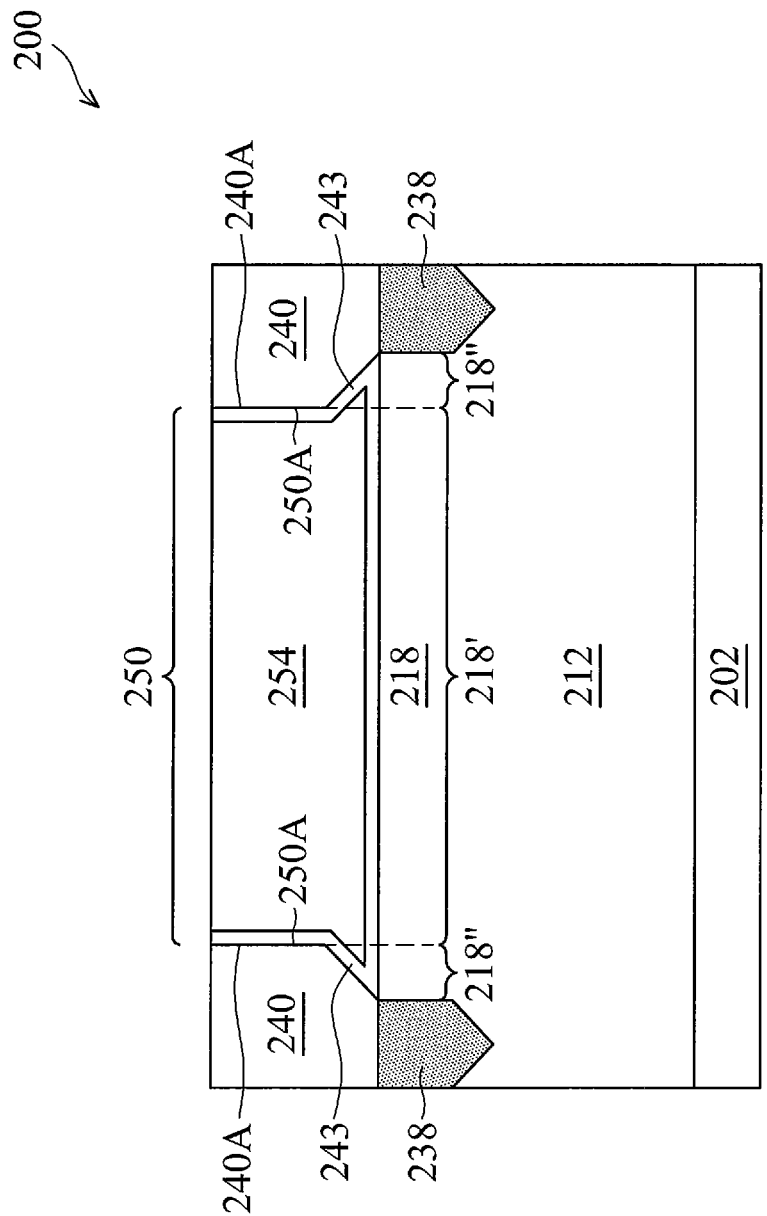

Corresponding to operation 128 of FIG. 1B, FIG. 14A is a perspective view of the FinFET 200 including a gate feature 250 formed by refilling the void 242 and the undercut 243 with a gate dielectric layer 252 and at least a conductive gate electrode 254 at one of the various stages of fabrication, according to some embodiments, FIG. 14B is a cross-sectional view of the FinFET 200 taken along line a-a (along the X direction) of FIG. 14A, and FIG. 14C is another cross-sectional view of the FinFET 200 taken along line b-b (along the Y direction) of FIG. 14A. Similar to FIG. 13A, the line a-a of FIG. 14A is taken across one of the removed poly footing features 234.

In some embodiments, the gate feature 250, including the gate dielectric layer 252 and the at least one conductive gate electrode 254, refills the void 242 (FIGS. 13A and 13C) to overlay the central portion 218' of the upper fin 218 (i.e., overlaying the sidewalls 218A and top surface 218B of the central portion 218' of the upper fin 218). In some embodiments, due to the undercut 243, in addition to overlaying the sidewalls 218A and top surface 218B of the central portion 218' of the upper fin 218, the gate dielectric layer 252 and the conductive gate electrode 254 can outwardly extend beyond the vertical projections of the sidewalls 240A of the second dielectric layer 240 (now becomes sidewalls 250A of the gate feature 250) to overlay the sidewalls 218A and top surface 218B at the side portions 218'' of the upper fin 218. In other words, the gate feature 250 traverses the central portion 218' of the upper fin 218 (i.e., the portion located inside the vertical projections of the sidewalls 250A of the gate feature 250) and further extends along the Y direction to overlay the side portions 218'' of the upper fin 218 (i.e., the portion respectively located outside the vertical projections of the sidewalls 250A of the gate feature 250), as further shown in FIGS. 14B and 14C.

As such, the conductive gate electrode 254 can thoroughly surround the upper fin 218 that serves as a conduction channel of the FinFET 200 according to some embodiments of the present disclosure. By covering the conduction channel more thoroughly with such a novel gate feature (e.g., 250), various advantages can be provided. For example, the disclosed FinFET 200 may have a stronger gate controllability and/or a less drain-induced barrier lowering (DIBL) effect.

In some embodiments, the gate dielectric layer 252 may include a high-k dielectric material. Such a high-k dielectric material includes oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In some embodiments, the high-k dielectric material is deposited to overlay the central portion 218' of the upper fin 218 by CVD, PVD, ALD, or the like.

In some embodiments, the conductive gate electrode 254 may include a metal material such as, for example, Al, Cu, W, Ti, Ta, TiN, TiAl, TiAlN, TaN, NiSi, CoSi, or combinations thereof. In some alternative embodiments, the conductive gate electrode 254 may include a polysilicon material, wherein the polysilicon material may be doped with a uniform or non-uniform doping concentration. The conductive gate electrode 254 may be formed using a suitable process such as ALD, CVD, PVD, plating, or combinations thereof. Although the conductive gate electrode 254 is shown as a single layer in the illustrated embodiments of FIGS. 14A-14C, it is understood that the conductive gate electrode 254 may include plural above-described metal materials stacked on top to one another.

In an embodiment, a semiconductor device includes a fin structure, disposed on a substrate, that horizontally extends along a direction; and a gate feature that traverses the fin structure to overlay a central portion of the fin structure and further extends along the direction to overlay at least a side portion of the fin structure that is located outside a vertical projection of a sidewall of the gate feature.

In another embodiment, a semiconductor device includes a fin structure, disposed on a substrate, that horizontally extends along a direction; and a gate feature comprising a gate dielectric layer and at least a first metal gate layer overlaying the gate dielectric layer, wherein the gate dielectric layer and the first metal gate layer traverse the fin structure to overlay a central portion of the fin structure and further extend along the direction to overlay at least a side portion of the fin structure that is located outside a vertical projection of a sidewall of the gate feature.

Yet in another embodiment, a method for forming a fin field-effect transistor (FinFET) includes forming a fin structure protruding a major surface of a substrate; exposing an upper portion of the fin structure by surrounding a lower portion of the fin structure; forming a dummy poly layer over the upper portion of the fin structure; etching an upper side portion of the dummy poly layer using a first etching process; etching a lower side portion of the dummy poly layer using a second etching process thereby exposing an end portion of the upper portion of the fin and forming a poly footing feature that extends beyond a vertical sidewall of a remaining portion of the dummy poly layer; forming a dielectric layer over the exposed end portion and along the vertical sidewall; and removing the remaining portion of the dummy poly layer and the poly footing feature thereby forming a void to expose a central portion and a side portion of the upper portion of the fin structure, wherein the side portion extends beyond a vertical projection of the vertical sidewall.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field-effect transistor (FinFET), comprising:
   forming a fin structure protruding from a surface of a substrate;
   forming a dummy poly layer over an upper portion of the fin structure;
   etching an upper side portion of the dummy poly layer using a first etching process;
   removing a remaining portion of the dummy poly layer thereby forming a void to expose a central portion and a side portion of the upper portion of the fin structure;
   etching a lower side portion of the dummy poly layer using a second etching process, wherein the second etching process exposes an end portion of the upper portion of the fin and forms a poly footing feature that extends beyond a vertical sidewall of the remaining portion of the dummy poly layer; and forming a gate feature over the upper portion of the fin structure.

2. The method of claim 1, further comprising forming a dielectric layer over the exposed end portion and along the vertical sidewall.

3. The method of claim 2, further comprising filling the void with a high-k dielectric layer.

4. The method of claim 1, wherein the gate feature overlays the central portion of the upper portion of the fin structure.

5. The method of claim 4, wherein the gate feature comprises a gate dielectric layer and at least a metal gate layer.

6. The method of claim 5, wherein the gate dielectric layer comprises a high-k dielectric layer.

7. The method of claim 4, wherein the gate feature surrounds sidewalls and a top surface of the central portion of the upper portion of the fin structure.

8. The method of claim 4, wherein the gate feature surrounds sidewalls and a top surface of the side portion of the upper portion of the fin structure.

9. The method of claim 4, further comprising forming a pair of source/drain features, along the fin structure, that are disposed at respective sides of the gate feature.

10. The method of claim 4, further comprising forming an oxide layer between the fin structure and the gate feature.

11. A semiconductor device, comprising:
a substrate;
a fin structure formed on the substrate; and
a gate feature formed over the fin structure, the gate feature comprising a gate dielectric layer,
wherein the gate dielectric layer traverses the fin structure to overlay a central portion of the fin structure and opposite side portions of the fin structure that are located in respective undercuts formed in respective portions of a dielectric layer, and wherein the opposite side portions of the fin structure extend beyond respective sidewalls of the gate feature and away from the central portion of the fin structure.

12. The semiconductor device of claim 11, wherein the gate dielectric layer comprises a high-k dielectric layer.

13. The semiconductor device of claim 11, further comprising a first metal gate layer overlaying the gate dielectric layer, wherein the gate feature comprises one or more metal gate layers, stacked on top to one another, on the first metal gate layer.

14. The semiconductor device of claim 13, wherein the gate dielectric layer and the first metal gate layer surround sidewalls and a top surface of the central portion of the fin structure.

15. The semiconductor device of claim 11, further comprising a pair of source/drain features formed along the fin structure, that are disposed at respective sides of the gate feature.

16. The semiconductor device of claim 11, further comprising an oxide layer disposed between the fin structure and the gate feature.

17. A semiconductor device, comprising:
a substrate;
a fin structure formed on the substrate;
a gate feature that traverses the fin structure to overlay a central portion of the fin structure, wherein the gate feature comprises a gate dielectric layer and at least a metal gate layer that extends along the fin structure to overlay opposite side portions of the fin structure that are located in respective undercuts formed in respective portions of a dielectric layer located adjacent to opposite sidewalls of the gate feature, and wherein opposite side portions of the fin structure extend beyond respective opposite sidewalls of the gate feature and away from the central portion of the fin structure; and
a pair of source/drain features formed along the fin structure and disposed at respective sides of the gate feature.

18. The semiconductor device of claim 17, further comprising:
an oxide layer disposed between the fin structure and the gate feature, wherein the gate feature further extends along the fin structure to overlay the opposite side portions of the fin structure.

19. The semiconductor device of claim 18, wherein the gate dielectric layer comprises a high-k dielectric layer.

20. The semiconductor device of claim 18, wherein the gate dielectric layer and the first metal gate layer surround sidewalls and top surfaces of the central portion and the side portions of the fin structure.

* * * * *